(12) United States Patent
Koda et al.

(10) Patent No.: US 12,431,895 B2
(45) Date of Patent: Sep. 30, 2025

(54) SWITCHING DEVICE, SWITCHING SYSTEM, AND CONTROL METHOD

(71) Applicants: Sumitomo Electric Industries, Ltd., Osaka (JP); Sumitomo Wiring Systems, Ltd., Yokkaichi (JP); AutoNetworks Technologies, Ltd., Yokkaichi (JP)

(72) Inventors: Naoya Koda, Osaka (JP); Takahisa Hirota, Osaka (JP)

(73) Assignees: Sumitomo Electric Industries, Ltd., Osaka (JP); Sumitomo Wiring Systems, Ltd., Yokkaichi (JP); AutoNetworks Technologies, Ltd, Yokkaichi (JP)

( * ) Notice: Subject to any disclaimer, the term of this patent is extended or adjusted under 35 U.S.C. 154(b) by 67 days.

(21) Appl. No.: 18/284,070

(22) PCT Filed: Mar. 30, 2021

(86) PCT No.: PCT/JP2021/013505
§ 371 (c)(1),
(2) Date: Sep. 26, 2023

(87) PCT Pub. No.: WO2022/208649
PCT Pub. Date: Oct. 6, 2022

(65) Prior Publication Data
US 2024/0305291 A1   Sep. 12, 2024

(51) Int. Cl.
 *H03K 17/687* (2006.01)
 *B60L 53/16* (2019.01)
 *B60L 53/60* (2019.01)

(52) U.S. Cl.
CPC ......... *H03K 17/6871* (2013.01); *B60L 53/16* (2019.02); *B60L 53/60* (2019.02)

(58) Field of Classification Search
CPC ...... H03K 17/6871; B60L 53/60; B60L 53/16
See application file for complete search history.

(56) References Cited

U.S. PATENT DOCUMENTS

2010/0295506 A1   11/2010   Ichikawa
2016/0200203 A1*   7/2016   Morita ................. B60L 3/0069
                                                            701/22

(Continued)

FOREIGN PATENT DOCUMENTS

JP   H08-037720 A   2/1996
JP   2005-149813 A   6/2005

(Continued)

*Primary Examiner* — Carlos Amaya
(74) *Attorney, Agent, or Firm* — XSENSUS LLP

(57) ABSTRACT

A switching device is mounted in a vehicle, and disposed between a connector connected to a DC power source, and a storage battery. The switching device includes: a transmission path connecting the connector and the storage battery; a semiconductor relay disposed on the transmission path; a switch disposed on the transmission path; a first sensor configured to measure a current flowing through the semiconductor relay, or a voltage of the semiconductor relay; and a controller configured to control opening and closing of the semiconductor relay. The switch is controlled by an external control signal, and the controller controls the semiconductor relay, based on the control signal and a measurement value of the first sensor.

10 Claims, 16 Drawing Sheets

(56) References Cited

U.S. PATENT DOCUMENTS

2017/0187179 A1* 6/2017 Morimoto .............. H02H 3/093
2023/0202338 A1* 6/2023 Harris ....................... B60L 3/04
                                                              320/109

FOREIGN PATENT DOCUMENTS

| JP | 2012-228060 A | 11/2012 |
|----|---------------|---------|
| JP | 2015-091156 A | 5/2015  |
| JP | 2017-114373 A | 6/2017  |
| WO | 2010/032309 A1 | 3/2010 |

* cited by examiner

PRIOR ART

SWITCHING DEVICE, SWITCHING SYSTEM, AND CONTROL METHOD

CROSS-REFERENCE TO RELATED APPLICATION

The present application is based on PCT/JP2021/013505, filed on Mar. 30, 2021, the entire contents of which are incorporated herein by reference.

TECHNICAL FIELD

The present disclosure relates to a switching device, a switching system, and a control method.

BACKGROUND ART

A secondary battery installed in a plug-in hybrid electric vehicle (hereinafter referred to as PHEV) or an electric vehicle (hereinafter referred to as EV) is charged by an external power supply. PATENT LITERATURE 1 discloses a charging system, for an electric motor vehicle, which can prevent generation of a short-circuit current even when a charging line is short-circuited. Specifically, with reference to FIG. 1, a charging system for an electric motor vehicle 12 includes a vehicle-side connector 30, charging line switches 28p and 28n, vehicle-side charging lines 46p and 46n, and a battery-for-traveling 24. The charging system further includes: a vehicle-side voltage sensor 38 disposed between the vehicle-side charging lines 46p and 46n; and a charger-side voltage sensor 66 disposed between charger-side charging lines 72p and 72n which electrically connect (hereinafter simply referred to as "connect") a DC power source 60 and a charger-side connector 62. The charging system further includes a diode 32, a bypass line 48 which bypasses the diode 32, a bypass line switch 34 and a resistance element 36 disposed on the bypass line 48, and an electronic control unit (ECU) 40.

When a short-circuit has occurred in the charging line, the charging system can prevent, with the diode 32, a reverse current (short-circuit current) from the battery-for-traveling 24 to a quick charger 14. In addition, the charging system can determine presence/absence of an insulation failure (short-circuit, etc.) before charging is started. When quick charging is performed, the vehicle-side connector 30 is connected to the charger-side connector 62, and a closing instruction is outputted to the charging line switches 28p and 28n and to the bypass line switch 34. At this time, if a difference of voltages detected by the vehicle-side voltage sensor 38 and the charger-side voltage sensor 66 exceeds a predetermined threshold value, the electronic control unit 40 determines that there is a possibility that an insulation failure (short-circuit, etc.) occurs in the charging line switch 28p or 28n, the bypass line 48, or the resistance element 36.

CITATION LIST

Patent Literature

PATENT LITERATURE 1: Japanese Laid-Open Patent Publication No. 2012-228060

SUMMARY OF THE INVENTION

A switching device according to one aspect of the present disclosure is a switching device mounted in a vehicle and disposed between a connector connected to a DC power source, and a storage battery. The switching device includes: a transmission path connecting the connector and the storage battery: a semiconductor relay disposed on the transmission path: a switch disposed on the transmission path; a sensor configured to measure a current flowing through the semiconductor relay, or a voltage of the semiconductor relay; and a controller configured to control opening and closing of the semiconductor relay. The switch is controlled by an external control signal, and the controller controls the semiconductor relay, based on the control signal and a measurement value of the sensor.

A switching system according to another aspect of the present disclosure includes the above-described switching device, and a switch controller configured to input the control signal to the switching device.

A control method according to still another aspect of the present disclosure is a control method for a switching device that is mounted in a vehicle and disposed between a connector connected to a DC power source, and a storage battery. The switching device includes a transmission path connecting the connector and the storage battery, a semiconductor relay disposed on the transmission path, and a switch disposed on the transmission path. The method includes: a first control step of controlling the switch by using a control signal; a measurement step of measuring a current flowing through the semiconductor relay, or a voltage of the semiconductor relay; and a second control step of controlling the semiconductor relay, based on the control signal and a measurement value obtained in the measurement step.

DETAILED DESCRIPTION

Figure 1:
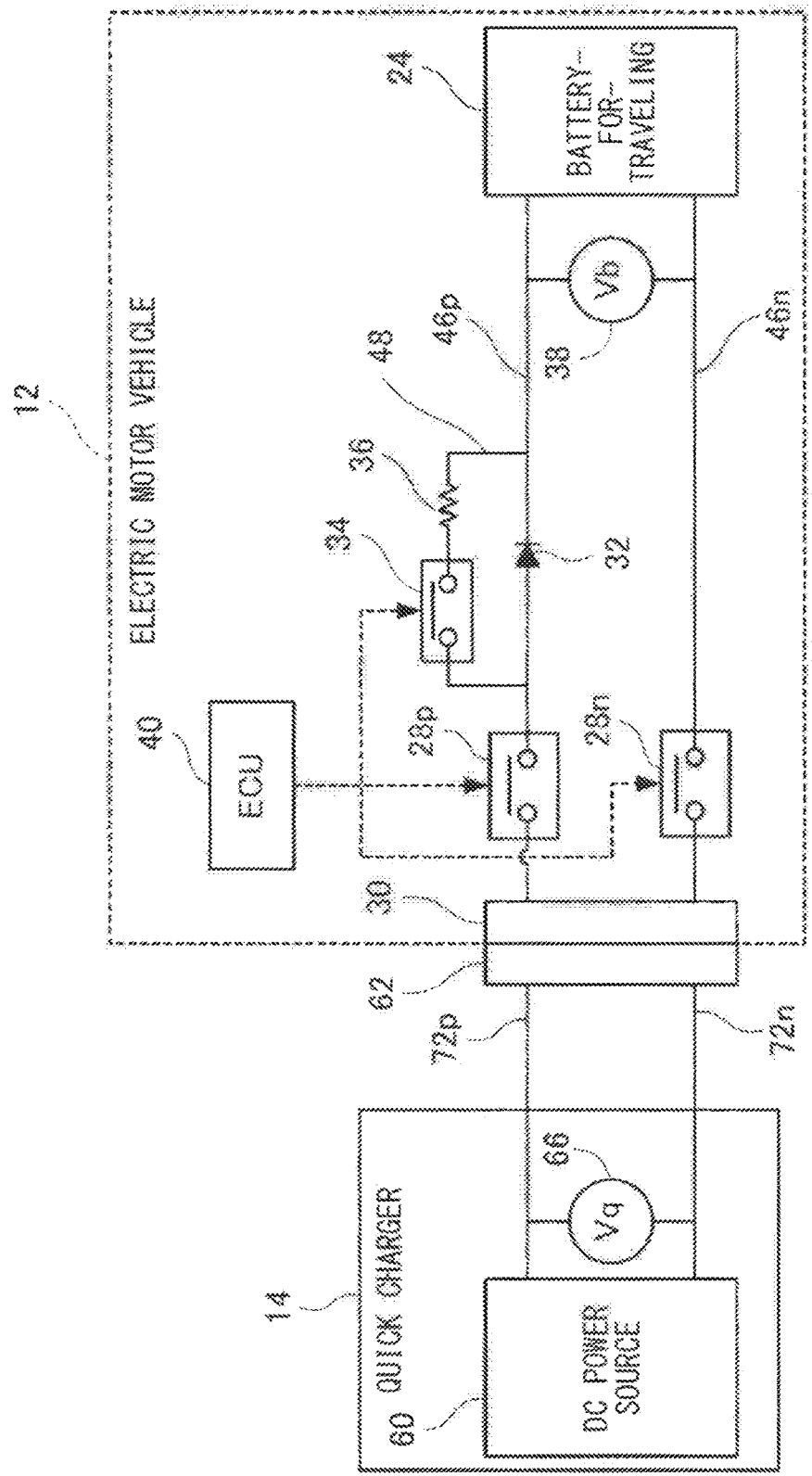
FIG. 1 is a block diagram showing a conventional charging system capable of preventing a short-circuit current.

Problems to be Solved by the Present Disclosure

In the charging system disclosed in PATENT LITERATURE 1, a large current flows in the diode 32 during quick charging of the battery-for-traveling 24. Therefore, the diode 32, which has a relatively large ON resistance value, generates a large amount of heat, and it is necessary to add a mechanism for cooling the diode 32, which is costly. In addition to opening/closing control for the charging line switches 28p and 28n, it is necessary to perform on/off control for the bypass line switch 34 in order to confirm the voltage of the storage battery before starting quick charging, which makes control for quick charging complicated.

Therefore, an object of the present disclosure is to provide a switching device, a switching system, and a control method capable of interrupting a short-circuit current without requiring a special cooling mechanism and without complicating control for quick charging.

Effects of the Present Disclosure

According to the present disclosure, it is possible to provide a switching device, a switching system, and a control method capable of interrupting a short-circuit current without requiring a special cooling mechanism and without complicating control for quick charging.

DESCRIPTION OF EMBODIMENTS OF THE PRESENT DISCLOSURE

Contents of embodiments of the present disclosure are listed and described. At least some parts of the embodiments described below may be combined together as desired.

(1) A switching device according to a first aspect of the present disclosure is a switching device mounted in a vehicle and disposed between a connector connected to a DC power source, and a storage battery. The switching device includes: a transmission path connecting the connector and the storage battery: a semiconductor relay disposed on the transmission path: a switch disposed on the transmission path; a first sensor configured to measure a current flowing through the semiconductor relay, or a voltage of the semiconductor relay; and a controller configured to control opening and closing of the semiconductor relay. The switch is controlled by an external control signal, and the controller controls the semiconductor relay, based on the control signal and a measurement value of the first sensor. Therefore, when a short-circuit has occurred in a transmission path, the transmission path can be promptly interrupted (opened), thereby preventing a short-circuit current from flowing from the storage battery. In addition, since the ON resistance of the semiconductor relay is relatively small, it is not necessary to prepare a special cooling mechanism that is required in the configuration where a charging current is supplied through a diode.

(2) Preferably, the controller includes a determination unit configured to determine presence/absence of a short-circuit of the transmission path, based on the measurement value of the first sensor, and controls opening and closing of the semiconductor relay, based on the control signal and a determination result of the determination unit. Therefore, the semiconductor relay can be controlled according to the control signal during normal time, and when a short-circuit has occurred, the transmission path can be interrupted by turning off the semiconductor relay, without changing control for the switch disposed on a charging line (transmission path).

(3) More preferably, the first sensor includes a voltage sensor, the voltage sensor measures a voltage between an input terminal and an output terminal of the semiconductor relay, and the determination unit determines presence/absence of a short-circuit of the transmission path, based on the voltage measured by the voltage sensor. Therefore, a short-circuit of the transmission path can be promptly detected. In addition, if presence/absence of a short-circuit of the transmission path is determined by using a one-way voltage of the semiconductor relay (a voltage difference that causes a short-circuit current and is zero in the state where a charging current flows), a threshold value for turning off the semiconductor relay (interrupting the transmission path) can be set to be smaller than the charging current. Thus, when a short-circuit has occurred, the semiconductor relay can be promptly turned off to prevent a short-circuit current from flowing.

(4) More preferably, in response to the determination unit having determined that the transmission path is short-circuited, the controller performs opening/closing control for the semiconductor relay without considering the control signal. Therefore, the semiconductor relay can be promptly turned off to prevent a short-circuit current from flowing. Since the turn-off of the semiconductor relay does not affect the state of the switch disposed on the charging line, the switch can be maintained in the closed state. Accordingly, if the determination of the short-circuit is erroneous determination, charging can be promptly restarted.

(5) Preferably, the opening/closing control for the semiconductor relay is an interruption control to open the semiconductor relay. Therefore, a short-circuit current can be promptly prevented from flowing.

(6) More preferably, the switching device further includes a reset unit configured to output a reset signal, in response to the determination unit having determined that the transmission path is short-circuited. The controller performs a control to close the semiconductor relay, in response to the reset signal being inputted, and maintains the semiconductor relay in an open state, after the interruption control has been performed a plurality of times within a predetermined time. Therefore, occurrence of a short-circuit can be more accurately detected, and if it is erroneous detection, quick charging can be maintained.

(7) More preferably, in a state where the transmission path is not short-circuited, the controller performs a synchronization control to control opening and closing of the semiconductor relay in synchronization with opening and closing of the switch. Therefore, it is not necessary to change control for the switch disposed on the charging line, and charging control can be performed in the conventional manner.

(8) Preferably, the synchronization control is a control to open and close the semiconductor relay, based on the control signal, without considering the measurement value of the first sensor. Therefore, in the situation where no short-circuit occurs, control for the switch can be performed in the conventional manner.

(9) More preferably, the switching device further includes: a second sensor configured to measure a voltage value at a connection node of the switch and the semiconductor relay; and a failure determination unit configured to determine presence/absence of a failure of the semiconductor relay, based on the voltage value detected by the second sensor. The failure determination unit determines presence/absence of a failure of the semiconductor relay, based on the control signal and the voltage value. Therefore, when the semiconductor relay is in failure, even if quick charging is instructed, execution of quick charging can be prevented. Thus, in the failure state in which the semiconductor relay is maintained in the ON state (stuck-ON state), occurrence of a short-circuit current can prevented. Meanwhile, in the feature state in which the semiconductor relay is maintained in the OFF state (stuck-OFF state), the body diode is prevented from generating abnormal heat due to execution of quick charging.

(10) A switching system according to a second aspect of the present disclosure includes: the above-described switching device; and a switch controller configured to input the control signal to the switching device. Therefore, when a short-circuit has occurred in a transmission path, the transmission path can be promptly interrupted (opened), thereby preventing a short-circuit current from flowing from the storage battery. In addition, since the ON resistance of the semiconductor relay is relatively small, it is not necessary to prepare a special cooling mechanism that is required in the configuration where a charging current is supplied through a diode.

(11) A control method according to a third aspect of the present disclosure is a control method for a switching device that is mounted in a vehicle and disposed between a connector connected to a DC power source, and a storage battery. The switching device includes a transmission path connecting the connector and the storage battery, a semiconductor relay disposed on the transmission path, and a switch disposed on the transmission path. The method includes: a first control step of controlling the switch by using a control signal; a measurement step of measuring a current flowing through the semiconductor relay, or a voltage of the semiconductor relay; and a second control step of controlling the semiconductor relay, based on the control signal and a measurement value obtained in the measurement step. Therefore, when a short-circuit has occurred in a transmission path, the transmission path can be promptly interrupted (opened), thereby preventing a short-circuit current from flowing from the storage battery.

DETAILS OF EMBODIMENT OF THE PRESENT DISCLOSURE

In the embodiments below, the same components are denoted by the same reference signs. The names and functions of such components are also the same. Therefore, detailed descriptions thereof are not repeated.

First Embodiment (Configuration)

Figure 2:
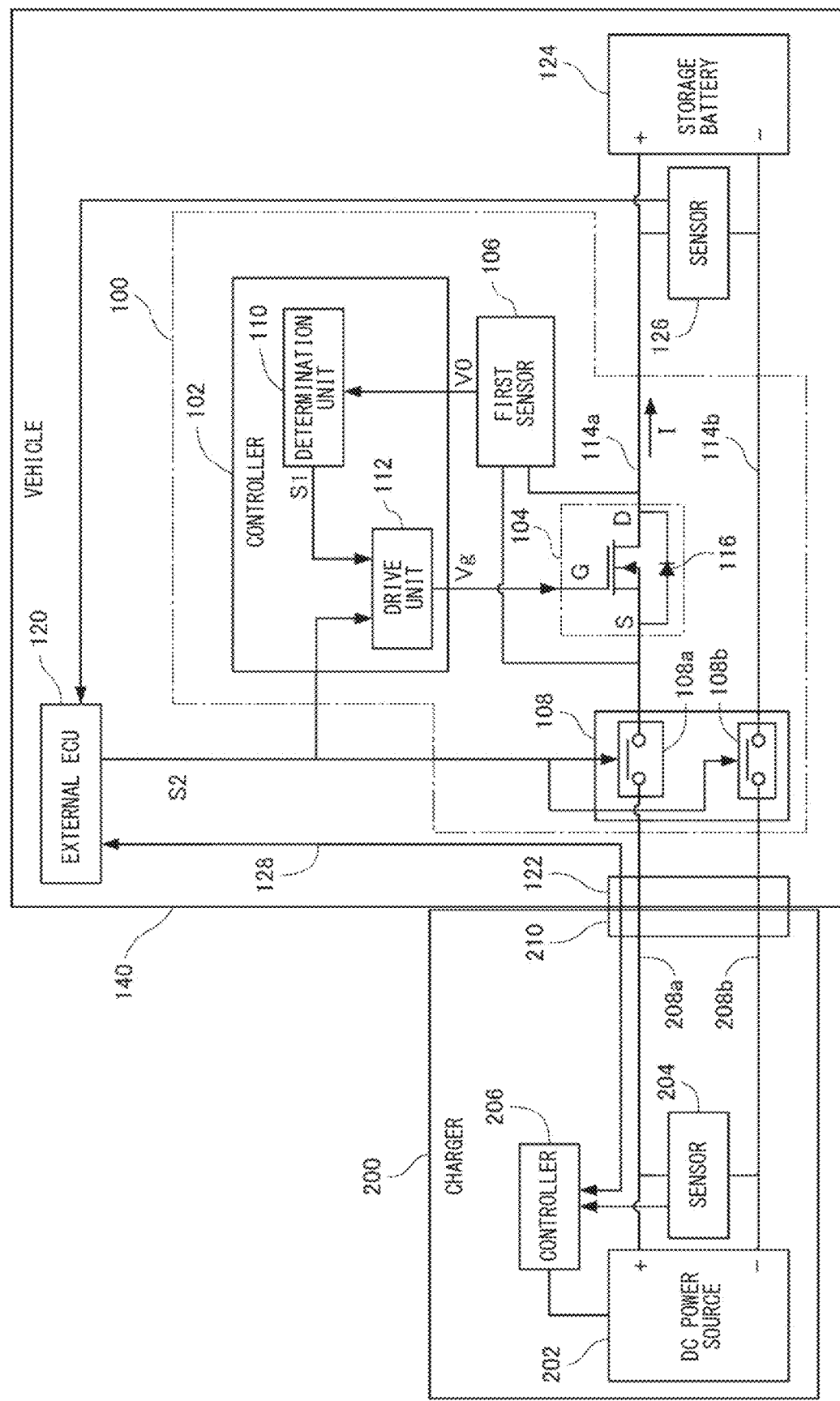
FIG. 2 is a block diagram showing a configuration of a switching device according to a first embodiment of the present disclosure.

With reference to FIG. 2, a switching device 100 according to the first embodiment of the present disclosure includes a controller 102, a semiconductor relay 104, a first sensor 106, a switch unit 108, and transmission paths 114a and 114b. The switching device 100 is mounted in a vehicle 140 together with an external ECU 120, a connector 122, a storage battery 124, and a sensor 126. The switching device 100 is disposed on the transmission paths that connect a charger 200 to the vehicle 140 to charge the storage battery 124. The vehicle 140 is a PHEV or an EV.

The controller 102 includes a determination unit 110 and a drive unit 112. The determination unit 110 has an arithmetic function. The determination unit 110 performs a control to turn off (open) the semiconductor relay 104, based on a predetermined threshold value Vth, as described later. Specifically, the determination unit 110 compares a signal (one-way voltage V0 described later) inputted from the first sensor 106, with the threshold value Vth, and outputs a control signal S1 according to a result of the comparison. That is, when V0≤Vth, the determination unit 110 outputs a control signal S1 at a low-level (hereinafter referred to as "L-level"), and when V0>Vth, the determination unit 110 outputs a control signal S1 at a high-level (hereinafter referred to as "H-level"). The determination unit 110 can be implemented by one or a plurality of processing circuits. The determination unit 110 can be implemented by an arithmetic element (IC chip such as ASIC, FPGA, etc.) having a relatively simple configuration. The determination unit 110 may be implemented by a CPU (Central Processing Unit), a microcomputer, or the like.

The threshold value Vth may be stored in advance in a memory (not shown) inside the controller 102, for example. Although the threshold value Vth is a voltage, when a breaking current is specified, a voltage value (Ith×R) corresponding to the breaking current (Ith) is calculated by using an ON resistance (R) of the semiconductor relay 104, and this voltage value may be used as the threshold value Vth.

The threshold value Vth needs to be set to a value within a range in which the semiconductor relay 104 described later is not damaged. When the storage battery 124 is quickly charged by the charger 200, a current I that flows through the semiconductor relay 104 during charging is a large charging current (e.g., 200 A). Therefore, in order to prevent the semiconductor relay 104 from being damaged, it is preferable to set the threshold value Vth so that a short-circuit current exceeding the charging current (200 A) does not flow even when the transmission path is short-circuited. For example, a value that is equal to or smaller than the product of 200 A and the ON resistance of the semiconductor relay 104 may be set as the threshold value Vth.

The drive unit 112 is a circuit for driving the semiconductor relay 104. The drive unit 112 receives an output signal (control signal S1) from the determination unit 110, generates a drive signal Vg according to the control signal S1 and a control signal S2 inputted from the external ECU 120 described later, and outputs the drive signal Vg to the semiconductor relay 104. Specifically, when the control signal S1 is at the L level, a signal at the same level as the control signal S2 is outputted as the drive signal Vg. When the control signal S1 is at the H level, a signal at a level obtained by inverting the control signal S1 (i.e., a signal at the L level) is outputted as the drive signal Vg, regardless of the level of the control signal S2. The drive signal Vg is used as a signal (gate voltage) for controlling opening and closing of the semiconductor relay 104.

The semiconductor relay 104 is a relay including a semiconductor element having a switching function. The semiconductor relay 104 is disposed on the transmission path 114a that connects one terminal (first terminal) among a plurality of terminals of the connector 122 to a positive electrode terminal of the storage battery 124. Here, it is assumed that the semiconductor relay 104 is an N-type MOSFET (hereinafter referred to as "N-MOSFET") capable of passing a large current. The semiconductor relay 104 has a source S connected to the switch unit 108, a drain D connected to the positive electrode terminal of the storage battery 124, and a gate G connected to an output terminal of the drive unit 112. The semiconductor relay 104 includes a diode 116 that a normal MOSFET structurally includes. Since the semiconductor relay 104 is an N-MOSFET, an anode (body of the N-MOSFET) and a cathode of the diode 116 are connected to the source S and the drain D, respectively. As described later, when the storage battery 124 is charged, the source S and the drain D of the semiconductor relay 104 serve as a charging current input terminal and a charging current output terminal, respectively.

Figure 3:
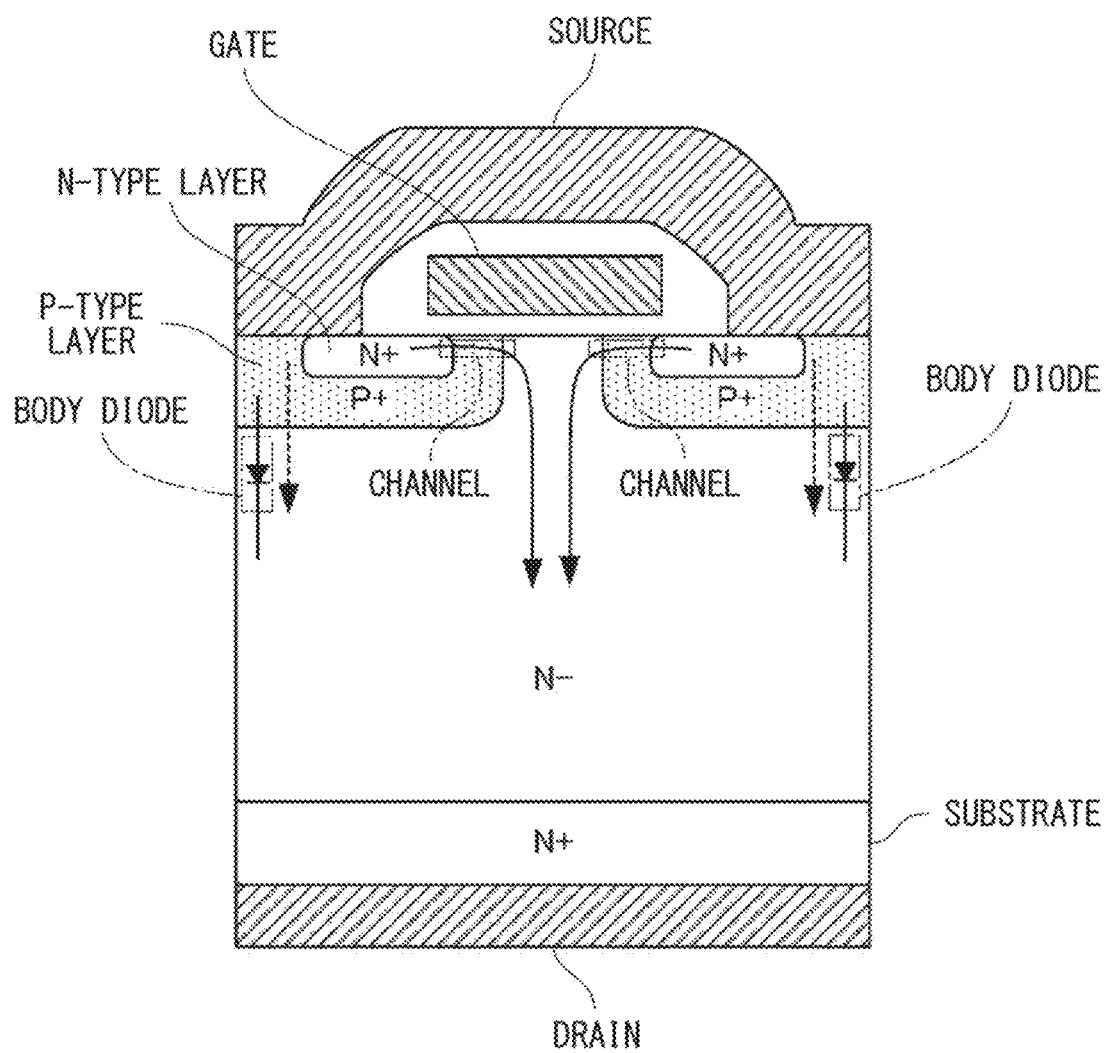
FIG. 3 is a cross-sectional view showing a structure of a MOSFET (Metal-Oxide-Semiconductor Field-Effect Transistor) used as a semiconductor relay.

An N-MOSFET responsible for the switching function of the semiconductor relay 104 will be specifically described with reference to FIG. 3. A positive voltage is applied to a source of the N-MOSFET (e.g., an SiC N-MOSFET), and a negative voltage is applied to a drain of the N-MOSFET with the source voltage as a reference. A positive voltage is applied to a gate of the N-MOSFET with the source voltage as a reference. In this state, a current (hereinafter also referred to as "drain current") flows from the source to the drain through a channel (an inversion layer formed beneath the gate in a P-type layer), as shown by a solid arrow in FIG. 3. Since the source voltage is higher than the drain voltage, a forward voltage is applied to the body diode and a current also flows through the body diode (refer to a broken-line arrow), but the current that flows through the channel having a low resistance is dominant.

Figure 4:
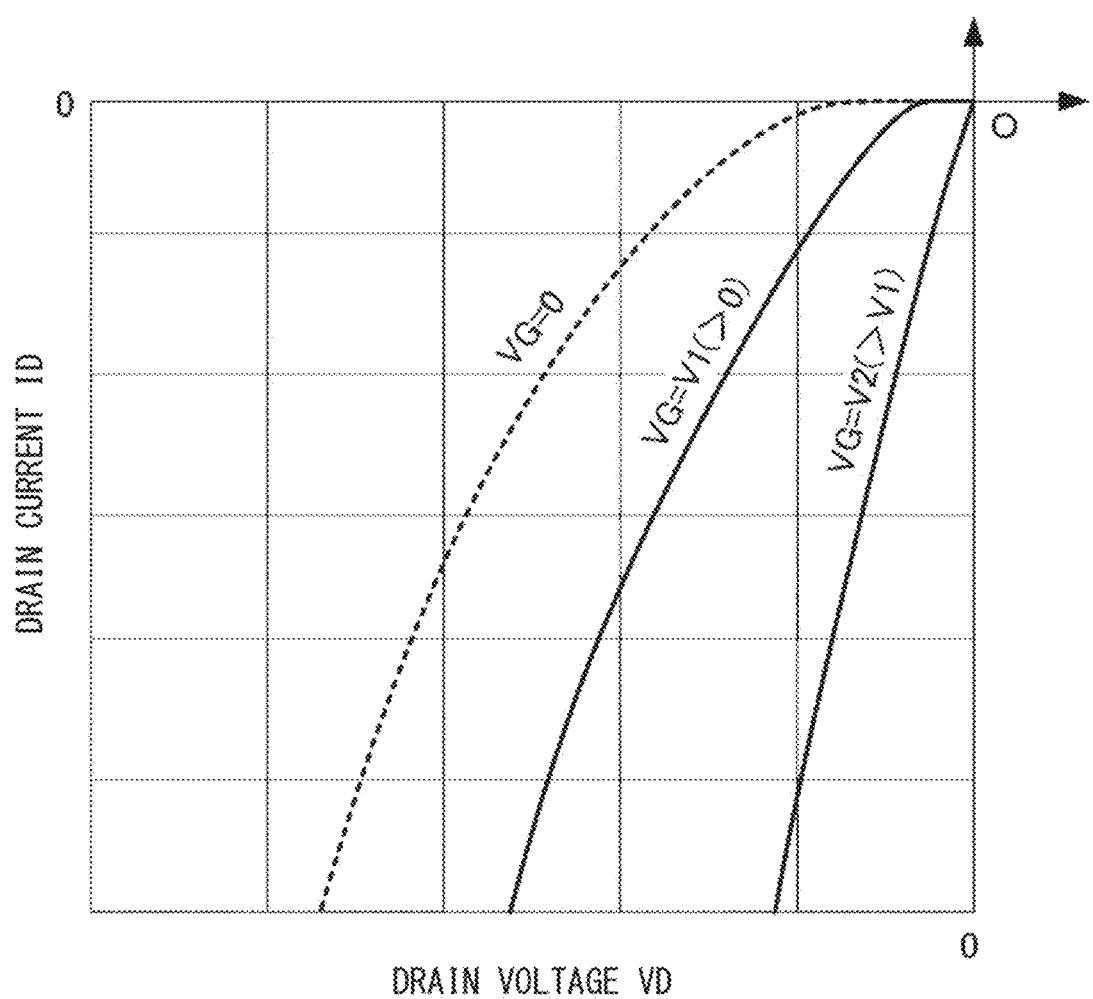
FIG. 4 is a graph showing voltage-current characteristics when a negative voltage is applied to a drain with a source voltage as a reference, in the MOSFET shown in FIG. 3.

FIG. 4 shows a graph (voltage-current characteristics) representing change in a drain voltage VD and a drain current ID under a constant gate voltage VG. With reference to FIG. 4, when the gate voltage VG is increased from 0 to V1 (>0) and V2 (>V1), the graph represented by a dotted line (VG=0) changes as shown by solid lines. In FIG. 4, the horizontal axis (the rightward direction is the positive direction) represents the drain voltage VD with a source voltage VS as a reference, and the vertical axis (the upward direction is the positive direction) represents the drain current ID that is positive in the direction from the source to the drain. The graph shown in FIG. 4 represents the voltage-current characteristics of the drain in domains where VD≤0 and ID≤0, with a point O) at the top right thereof being an origin point ((VD, ID)=(0, 0)). When VG=0, no current flows through the channel, so that the graph of VG=0 represents the voltage-current characteristics of the body diode.

The first sensor 106 detects a voltage between the source S and the drain D of the semiconductor relay 104. Here, the first sensor 106 detects a voltage Vs at the source S and a voltage Vd at the drain D. and generates a one-way voltage V0 according to the detected values, taking into account the direction of the current flowing through the semiconductor relay 104. Specifically, the one-way voltage V0 is V0=Vd− Vs when Vd≥Vs, and is V0=0 when Vd<Vs. That is, the one-way voltage V0 is the drain voltage with the source voltage as a reference, and means a voltage at which a current (short-circuit current) flowing from the drain D to the source S of the semiconductor relay 104 occurs. When a current (charging current) flowing from the source S to the drain D of the semiconductor relay 104 occurs, the one-way voltage V0 is 0. The one-way voltage V0 is inputted from the first sensor 106 to the determination unit 110 as described above.

The switch unit 108 includes a first switch 108a and a second switch 108b. The first switch 108a is disposed on the transmission path 114a that connects the first terminal among the plurality of terminals of the connector 122 to the positive electrode terminal of the storage battery 124. The connector 122 has a form to be coupled with a connector 210 described later. For example, if the connector 210 is a plug, the connector 122 is a socket. The second switch 108b is disposed on a transmission path 114b that connects a second terminal different from the first terminal among the plurality of terminals of the connector 122, to a negative electrode terminal of the storage battery 124. More specifically, the first switch 108a is disposed between the first terminal of the connector 122 and the source S of the semiconductor relay 104. The first switch 108a and the second switch 108b connect the storage battery 124 and the connector 122 when they are closed, and disconnect the storage battery 124 and the connector 122 when they are open. The first switch 108a and the second switch 108b are each an electromagnetic switch having an electromagnet and a mechanical contact. Opening and closing of the first switch 108a and the second switch 108b are controlled by a control signal S2 from the external ECU 120.

The external ECU 120 outputs the control signal S2 for controlling opening and closing of the first switch 108a and the second switch 108b, to the first switch 108a and the second switch 108b and to the drive unit 112, as described above. That is, the external ECU 120 serves as a switch controller for controlling the first switch 108a and the second switch 108b included in the switching device 100. The external ECU 120 is implemented by a CPU, a microcomputer, or the like, for example. The external ECU 120 performs a process described later by executing a predetermined program. The program that the external ECU 120 executes is stored in a non-volatile storage device inside the external ECU 120 or a non-volatile storage device outside the external ECU 120.

The storage battery 124 is a chargeable/dischargeable high voltage (e.g., about 300 V) secondary battery. The storage battery 124 supplies electric power to a drive mechanism (motor, etc.) of the vehicle 140 (PHEV or EV) to operate the drive mechanism.

The sensor 126 measures a voltage between the transmission paths 114a and 114b at predetermined time intervals, or at a timing of receiving an instruction from the outside. Upon receiving a request from the outside, the sensor 126 transmits a measurement value to the request source. For example, the external ECU 120 relating to quick charging acquires the measurement value of the sensor 126 before starting quick charging to confirm the charged state of the storage battery 124. During quick charging, the measurement value of the sensor 126 is used for monitoring the charging state of the storage battery 124. The measurement value of the sensor 126 may be transmitted to the charger 200 through a communication line 128 described later via the connector 122 and the connector 210.

The charger 200 includes a DC power source 202, a sensor 204, a controller 206, transmission paths 208a and 208b, and a connector 210. The controller 206 receives instructions to start and stop charging, from the external ECU 120 mounted in the vehicle 140 through the communication line 128. The communication line 128 is formed when the connector 210 is mounted to the connector 122 and thereby wiring in the vehicle 140 is connected to wiring in the charger 200. Under the control of the controller 206, the DC power source 202 outputs power (DC) for charging the storage battery 124.

A positive electrode terminal and a negative electrode terminal of the DC power source 202 are connected to the transmission path 208a and the transmission path 208b, respectively. The transmission paths 208a and 208b are connected to the connector 210. The connector 210 is, for example, a plug, and the transmission paths 208a and 208b are, for example, implemented as cables that connect the body of the charger 200 and the connector 210. The transmission path 208a is connected to one terminal (hereinafter referred to as "third terminal") among a plurality of terminals of the connector 210, and the transmission path 208b is connected to a fourth terminal different from the third terminal among the plurality of terminals of the connector 210. When the connector 210 is mounted to the connector 122, the first terminal and the second terminal of the connector 122 are connected to the third terminal and the fourth terminal of the connector 210, respectively. Therefore, the output power of the DC power source 202 is transmitted to the storage battery 124 through the first switch 108a, the second switch 108b, and the semiconductor relay 104 which are disposed on the transmission paths 114a and 114b.

The sensor 204 measures a voltage between the transmission paths 208a and 208b. The controller 206 appropriately uses the measurement value of the sensor 204 to control the DC power source 202. The controller 206 may transmit the measurement value of the sensor 204 to the external ECU 120 through the communication line 128.

(Operation During Charging)

Figure 5:
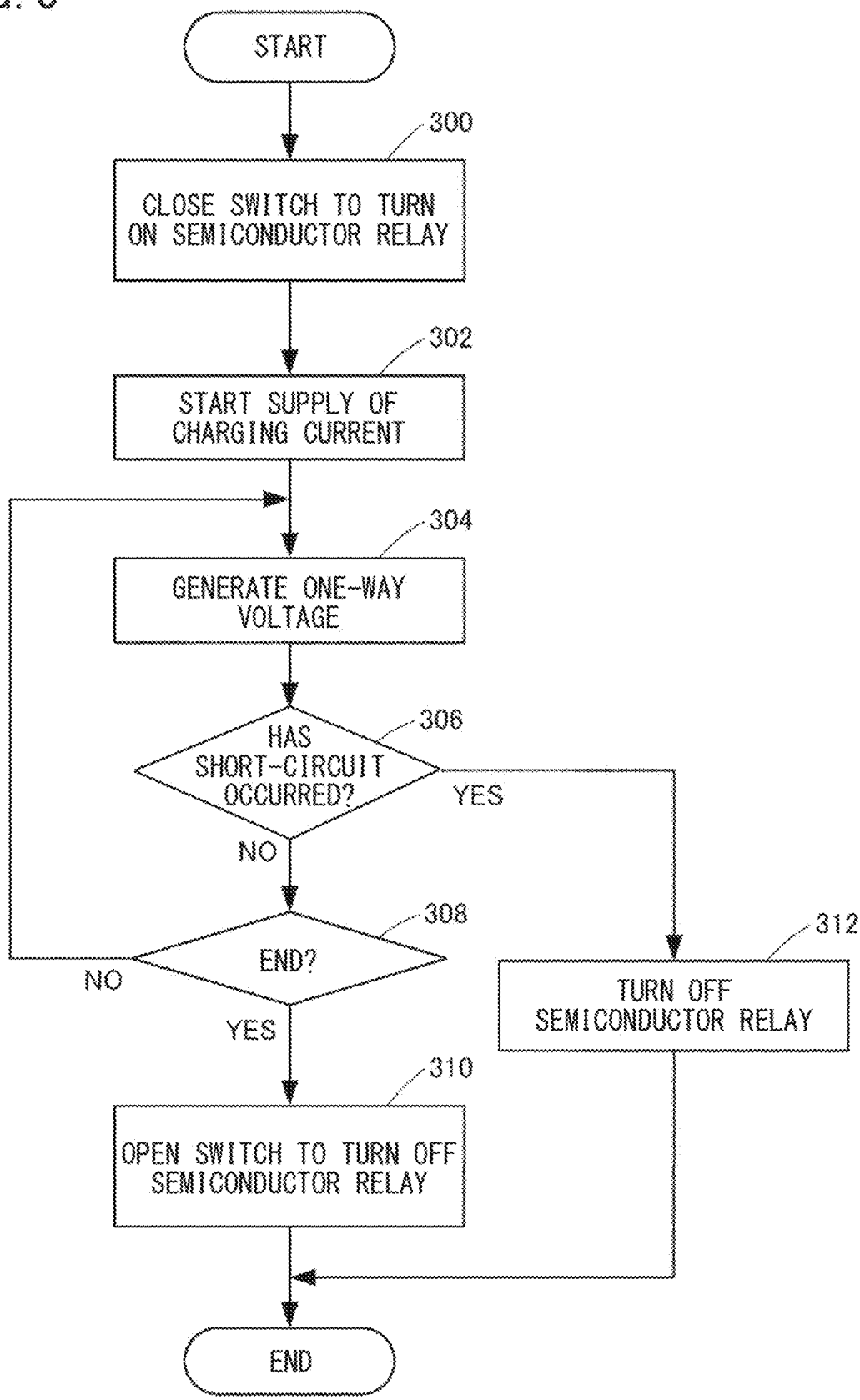
FIG. 5 is a flowchart showing an operation when a storage battery is charged in the configuration shown in FIG. 2.
Figure 6:
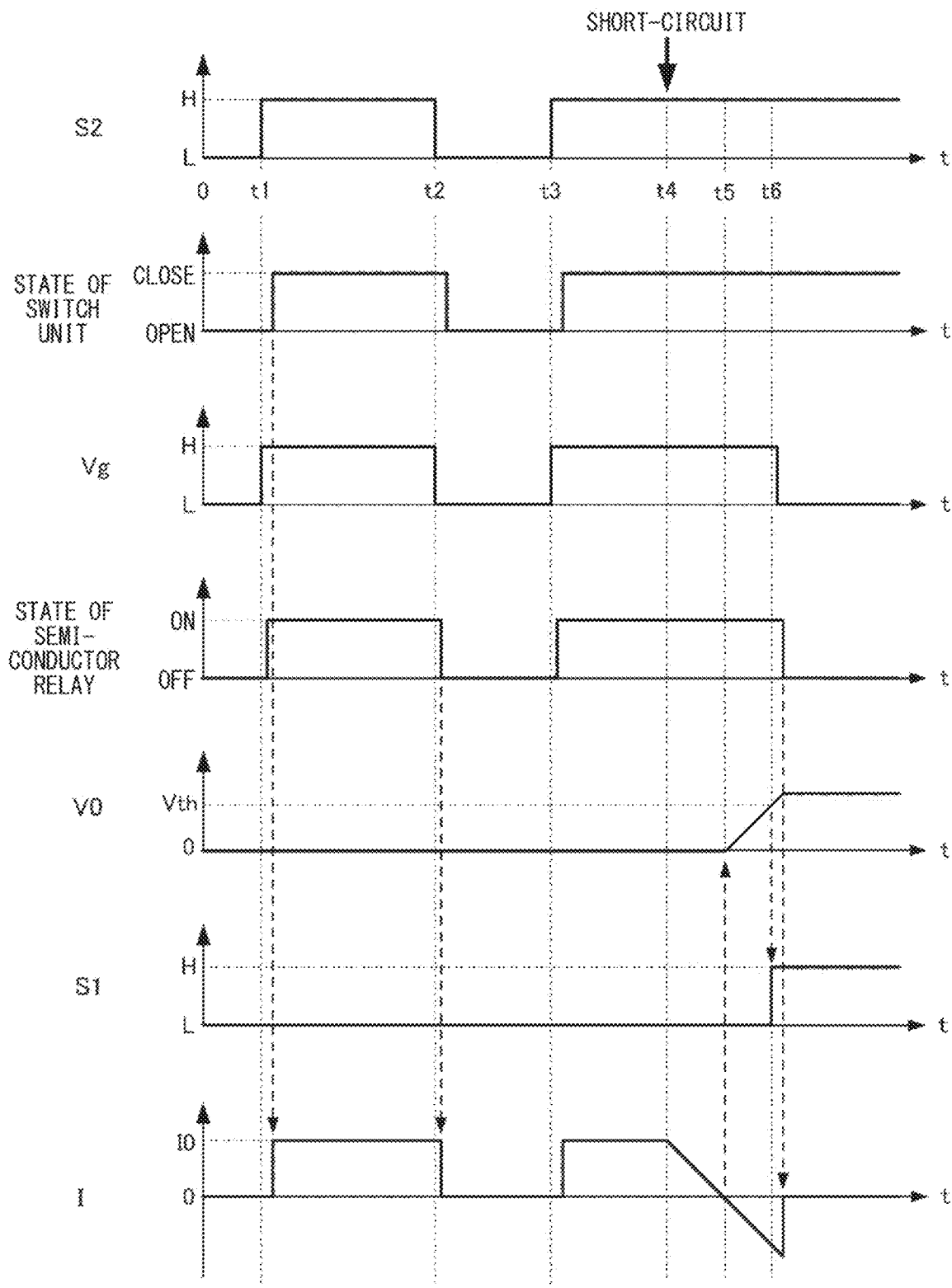
FIG. 6 is a timing chart showing an operation of the switching device shown in FIG. 2.

With reference to FIG. 5 and FIG. 6, the operation of the switching device 100 during charging will be described. Processing shown in FIG. 5 is started when the vehicle 140 stops (the drive mechanism is stopped because the vehicle stops), the connector 210 is mounted to the connector 122, and an operation to instruct quick charging is performed on an operation device (not shown). The processing shown in FIG. 5 is implemented by cooperation of the components constituting the vehicle 140 and the charger 200 shown in FIG. 2, including the switching device 100.

Waveforms shown in FIG. 6 represent, from the top, the control signal S2 outputted from the external ECU 120, the state of the switch unit 108, the drive signal Vg (the gate voltage of the semiconductor relay 104), the state of the semiconductor relay 104, the one-way voltage V0, the control signal S1 outputted from the determination unit 110, and the current I flowing through the semiconductor relay 104. The horizontal axis represents time t that is common to all the waveforms. The current I is a drain current, and is positive in a direction from the source S to the drain D of the semiconductor relay 104 (direction from the charger 200 to the storage battery 124). When I>0, the current I is a charging current for charging the storage battery 124. When I<0, the current I is a short-circuit current outputted from the storage battery 124.

During 0≤t<t1, the vehicle 140 stops, the control signal S2 is at the L level, and the switch unit 108 is in the open state. At this time, the one-way voltage V0 is 0, the control signal S1 outputted from the determination unit 110 is at the L level, and the drive unit 112 outputs a signal at the same level (L level) as the control signal S2, as described above. Therefore, the semiconductor relay 104 is OFF (stopped state).

At t=t1, when quick charging is instructed as described above, the switch unit 108 is closed to turn on the semiconductor relay 104 in step 300. Thereafter, the control proceeds to step 302. Specifically, the external ECU 120 outputs the H level control signal S2, and after a slight delay, the switch unit 108 is closed. The control signal S2 is inputted to the switch unit 108 and simultaneously to the drive unit 112. At this time, the one-way voltage V0 outputted from the first sensor 106 is 0, and the control signal S1 outputted from the determination unit 110 is at the L level. Therefore, as described above, the drive unit 112 outputs the drive signal Vg at the same level (H level) as the control signal S2. The level (H level or L level) of the drive signal Vg is based on the voltage of the source S. Since the switch unit 108 is a mechanical unit, the timing at which the semiconductor relay 104 is turned on is earlier than the timing at which the switch unit 108 is closed, as shown in FIG. 6.

In step 302, supply of a charging current for quickly charging the storage battery 124 is started. Thereafter, the control proceeds to step 304. Specifically, the external ECU 120, through the communication line 128, instructs the controller 206 of the charger 200 to supply the charging current. Upon receiving this instruction, the charger 200 outputs power from the DC power source 202. As described above, when the switch unit 108 is closed in step 300, a positive voltage from the DC power source 202 is applied to the source S of the semiconductor relay 104. Since the positive voltage from the storage battery 124 is applied to the drain D of the semiconductor relay 104, if the positive voltage from the DC power source 202 is higher than the positive voltage from the storage battery 124 (i.e., if the drain voltage Vd based on the source voltage is negative (Vd<0)), the drive signal Vg becomes the H level, whereby the semiconductor relay 104 turns on and enters the driven state. Therefore, the power supplied from the DC power source 202 causes the positive current I to flow from the source S to the drain D of the semiconductor relay 104 (I=I0 in FIG. 6). As a result, the storage battery 124 is charged (quick charging by the charger 200). At this time, a current flowing through the diode 116 is included in the current I, but a current flowing through the channel having the lower resistance is dominant.

In step 304, the one-way voltage V0 is generated. Specifically, the first sensor 106 detects a difference in voltage between the input terminal (source S) and the output terminal (drain D) of the semiconductor relay 104, generates the one-way voltage V0 according to the voltage difference as described above, and outputs the one-way voltage V0. Thereafter, the control proceeds to step 306.

In step 306, presence/absence of a short-circuit of the transmission path is determined. Specifically, the determination unit 110 determines whether or not the one-way voltage V0 outputted from the first sensor 106 is equal to or higher than the threshold value Vth, thereby determining whether or not a short-circuit has occurred in the transmission path. When the determination unit 110 has determined that V0≥Vth (short-circuit has occurred), the determination unit 110 outputs the H level control signal S1 as described above. With the determination result that V0≥Vth, the control proceeds to step 312. Otherwise, the control proceeds to step 308.

If a short-circuit does not occur, in step 308, the external ECU 120 determines whether or not to end the quick charging. When it has been determined to end the quick charging, the control proceeds to step 310. Otherwise, the control returns to step 304. For example, when the storage battery 124 is fully charged or when an end instruction is made through an operation on the operation device, it is determined to end the quick charging.

In step 310, the switch unit 108 is opened to turn off the semiconductor relay 104. Specifically, the external ECU 120 outputs the L level control signal S2. Then, this program is ended. As a result, the switch unit 108 is opened, and the semiconductor relay 104 is turned off. Therefore, if a short-circuit does not occur and the external ECU 120 does not determine to end charging, steps 304 to 308 are repeatedly performed, and the quick charging state is maintained.

When the determination result in step 306 is that a short-circuit has occurred, the semiconductor relay is turned off in step 312. Specifically, as described above, upon receiving the H level control signal S1 from the determination unit 110, the drive unit 112 outputs the L level drive signal Vg, regardless of the level of the control signal S2 outputted from the external ECU 120. As a result, the semiconductor relay 104 is promptly turned off, thereby preventing a short-circuit current from flowing. Then, this program is ended.

FIG. 6 shows that quick charging is performed (repetition of steps 304, 306, and 308) during t1<t<t2, and it is determined to end the quick charging at t=t2 (the determination result in step 308 is YES). At t=t2, when the control signal S2 outputted from the external ECU 120 becomes the L level (see step 310), the switch unit 108 is opened after a slight delay. At this time, the one-way voltage V0 outputted from the first sensor 106 is 0, and the control signal S1 outputted from the determination unit 110 is at the L level. Therefore, as described above, the drive unit 112 outputs the drive signal Vg at the same level (L level) as the control signal S2, and the semiconductor relay 104 is turned off (stopped state). Since the switch unit 108 is a mechanical unit, the timing at which the semiconductor relay 104 is turned off is earlier than the timing at which the switch unit 108 is closed, as shown in FIG. 6. That is, the drive signal Vg becomes the L level, in the state where the positive voltage from the DC power source 202 is applied to the source S of the semiconductor relay 104 and the positive voltage from the storage battery 124 is applied to the drain D of the semiconductor relay 104. As a result, the current I becomes zero.

Thereafter, when quick charging is instructed again at t=t3, the control signal S2 outputted from the external ECU 120 becomes the H level (see step 300). Then, as described above with respect to t=t1, the switch unit 108 is closed, the semiconductor relay 104 is turned on (driven state), and the current I (I=I0) flows, whereby the storage battery 124 is charged.

It is assumed that, during charging of the storage battery 124, a short-circuit occurs in the transmission path at t=t4 (the determination result in step 306 is YES). The short-circuit causes step 312 to be executed. That is, the source voltage of the semiconductor relay 104 drops, and the current I decreases (the current flowing through the channel decreases). When the source voltage of the semiconductor relay 104 further drops to be lower than the drain voltage, the direction of the current flowing through the channel of the semiconductor relay 104 is reversed (the current I changes from positive to negative). At this time, the one-way voltage V0 outputted from the first sensor 106 becomes larger than 0 (see t=t5 in FIG. 6). Thereafter, due to the drop of the source voltage of the semiconductor relay 104, the one-way voltage V0 outputted from the first sensor 106 further increases. When the one-way voltage V0 inputted from the first sensor 106 becomes equal to or higher than the threshold value Vth, the determination unit 110 changes the control signal S1 from the L level to the H level. Thus, the drive unit 112 outputs the drive signal Vg at the level (L level) obtained by inverting the level (H level) of the control signal S1, regardless of the control signal S2 inputted from the external ECU 120. As a result, the semiconductor relay 104 is turned off, and a channel current does not flow. Since the state where the drain voltage is higher than the source voltage is equivalent to the reversely biased state for the body diode, a current does not flow through the body diode. That is, the charging line (transmission path) is interrupted. In this state, the switch unit 108 remains closed.

As described above, when a short-circuit has occurred in the transmission path on the charger 200 side with respect to the semiconductor relay 104 (on the left side of the semiconductor relay 104), the switching device 100 mounted in the vehicle 140 turns off (opens) the semiconductor relay 104 to promptly interrupt the transmission path, thereby preventing a short-circuit current from flowing from the storage battery 124. In addition, since the transmission path can be interrupted regardless of the state of the switch unit 108, the state of the switch unit 108 can be maintained even when a short-circuit has been detected. Therefore, if detection of a short-circuit of the transmission path is an erroneous detection, quick charging can be promptly resumed by only turning on the semiconductor relay 104.

Since the ON resistance of the semiconductor relay 104 is relatively small, the amount of heat generation is small even when a large charging current flows in the semiconductor relay 104 during quick charging of the storage battery 124. Therefore, a cooling device, which is required when a charging current is flowed through a diode as described in PATENT LITERATURE 1, is not required, thereby suppressing an increase in cost. Moreover, when a short-circuit has occurred, the transmission path can be promptly interrupted before a large short-circuit current flows. Therefore, a low-breakdown-voltage product can be adopted as the switch unit 108, thereby reducing the total cost.

During charging of the storage battery 124, control for the switch unit 108 is synchronized with control for the semiconductor relay 104. That is, the control signal for the switch unit 108 (the control signal S2 from the external ECU 120) is used as it is for controlling the semiconductor relay 104. Therefore, in the situation where no short-circuit occurs, it is not necessary to independently control the semiconductor relay 104, and control for the switch may be performed in the conventional manner, thereby simplifying the control system.

Moreover, since the one-way voltage V0 is used for detecting presence/absence of a short-circuit, the threshold value Vth for turning off the semiconductor relay 104 can be set to a value smaller than a voltage difference that is generated, due to a charging current, between the both ends (the source and the drain) of the semiconductor relay 104. For example, when presence/absence of a short-circuit is determined based on an absolute value of the voltage difference between the both ends of the semiconductor relay 104 without taking into account the current direction (i.e., whether the drain voltage is positive or negative), it is necessary to set the threshold value (absolute value) to a value larger than the voltage between the both ends of the semiconductor relay 104 during quick charging, in order to prevent the semiconductor relay 104 from being turned off during quick charging.

In contrast to the above, by using the one-way voltage V0, the threshold value Vth can be set to any value. For example, a value smaller than the voltage difference between the both ends of the semiconductor relay 104 during quick charging may be set as the threshold value Vth. A case of using a positive threshold value Vth1 (Vth>Vth1>0) that is smaller than the threshold value Vth (>0), will be described with reference to FIG. 7.

Figure 7:
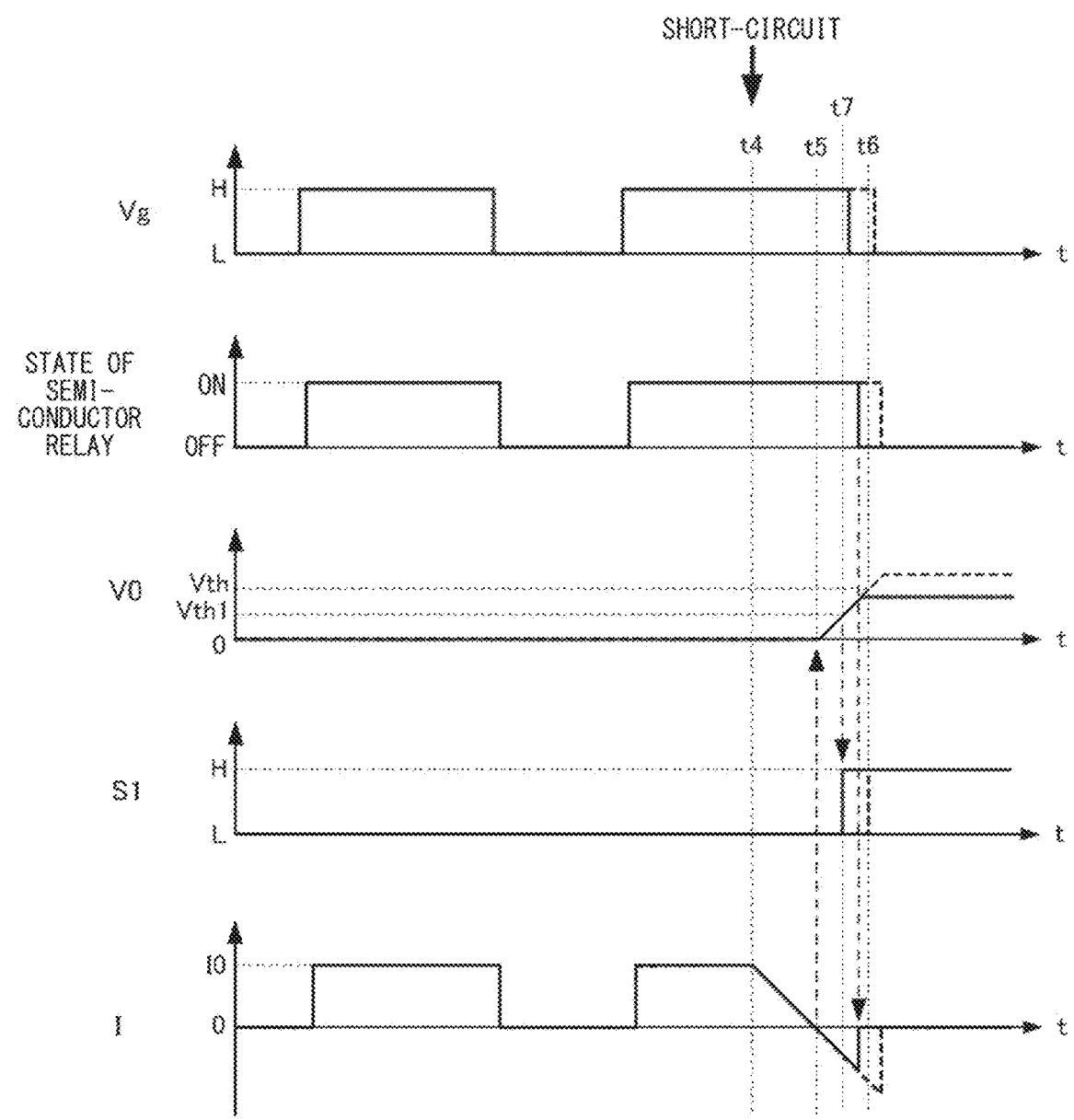
FIG. 7 is a timing chart showing an effect achieved when a threshold value is reduced.

FIG. 7 shows the drive signal Vg, the state of the semiconductor relay 104, the one-way voltage V0, the control signal S1, and the current I, as in FIG. 6. In FIG. 7, waveforms obtained when the threshold value is Vth (the same waveforms as in FIG. 6) are indicated by broken lines. In FIG. 7, the waveforms before occurrence of a short-circuit (until t=t4) are the same as those in FIG. 6.

As described above, the current I decreases after t=t4, becomes I=0 at t=t5, and thereafter becomes I<0 when V0>0. While V0<Vth1, the determination unit 110 still outputs the L level control signal S1. When the one-way voltage V0 further increases and the determination unit 110 has determined that V0≥Vth1, the determination unit 110 outputs the H level control signal S1. Then, the drive unit 112 outputs the drive signal Vg at a level (L level) obtained by inverting the control signal S1, regardless of the level of the control signal S2, whereby the semiconductor relay 104 is turned off. As a result, the current I becomes 0. At this time, since the threshold value Vth1 is smaller than the threshold value Vth, the semiconductor relay 104 is turned off and the current I becomes 0 at the timing of t=t7 before t=t6. That is, by setting the smaller threshold value, the transmission path can be interrupted more promptly to prevent a short-circuit current.

In the above description, when a short-circuit has been detected, the semiconductor relay 104 is turned off while the switch unit 108 is maintained in the closed state. However, the present disclosure is not limited thereto. When a short-circuit has occurred, the switch unit 108 may be opened. For example, a signal line may be disposed between the determination unit 110 and the external ECU 120, and when the determination unit 110 outputs the control signal S1 (when a short-circuit has occurred), a predetermined signal may be transmitted from the determination unit 110 to the external ECU 120. Upon receiving the predetermined signal, the external ECU 120 can set the control signal S2 to the L level to set the switch unit 108 in the open state.

Second Embodiment

In the first embodiment, the semiconductor relay is promptly turned off upon detection of a short-circuit, but there is a possibility of erroneous detection. The second embodiment has a function of interrupting a short-circuit current as in the first embodiment, and can cope with erroneous detection of a short-circuit.
(Configuration)

Figure 8:
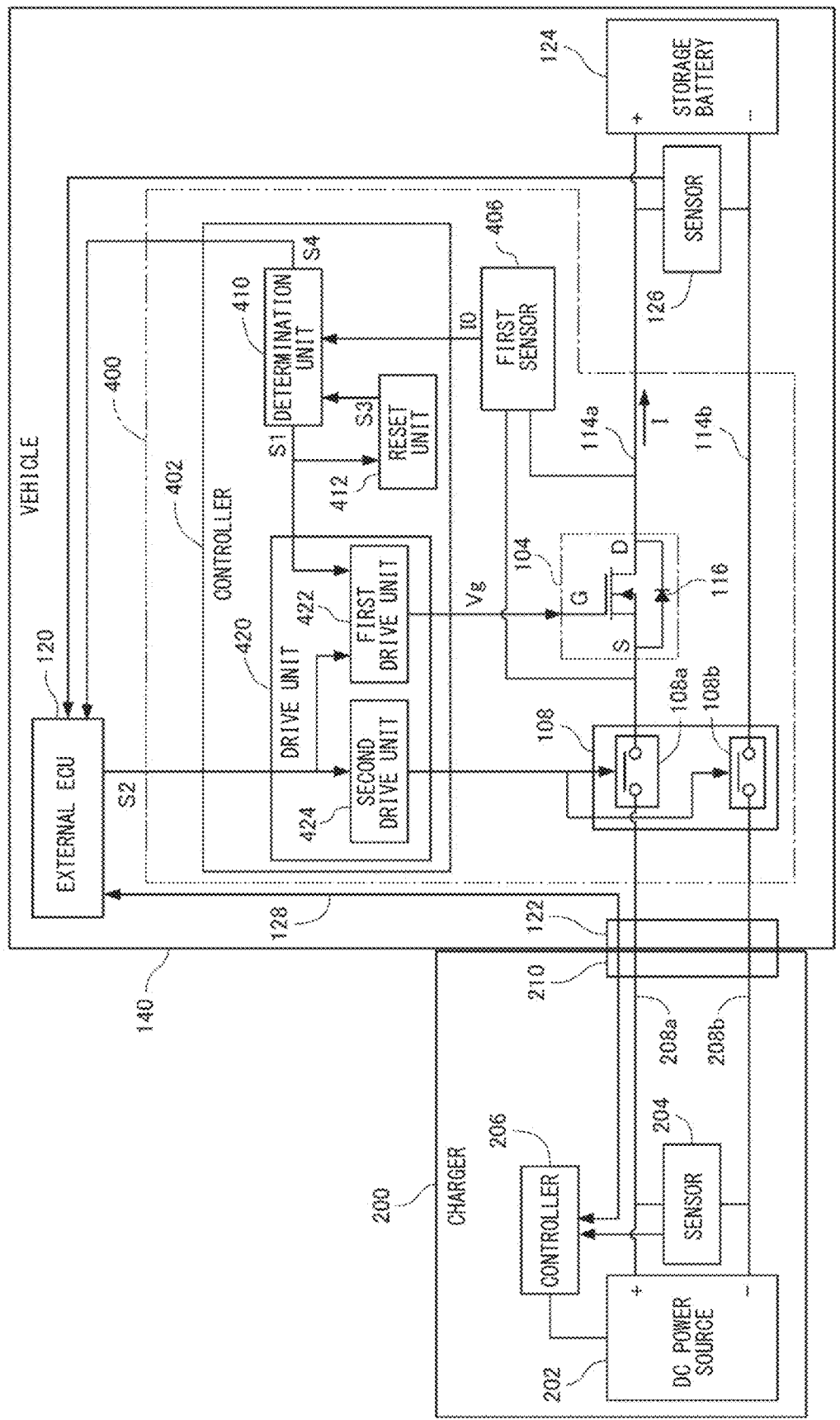
FIG. 8 is a block diagram showing a configuration of a switching device according to a second embodiment of the present disclosure.

With reference to FIG. 8, a switching device 400 according to the second embodiment of the present disclosure includes a controller 402, a semiconductor relay 104, a first sensor 106, a switch unit 108, and transmission paths 114a and 114b. The switching device 400 is mounted in a vehicle 140 together with an external ECU 120, a connector 122, a storage battery 124, and a sensor 126. The switching device 400 is disposed on the transmission paths that connect a charger 200 to the vehicle 140 to charge the storage battery 124.

The controller 402 includes a determination unit 410, a reset unit 412, and a drive unit 420. The drive unit 420 includes a first drive unit 422 and a second drive unit 424. The switching device 400 is identical to the switching device 100 shown in FIG. 2 except that the controller 102 and the first sensor 106 are replaced with the controller 402 and a first sensor 406, respectively. The controller 402 is identical to the controller 102 shown in FIG. 2 except that the determination unit 110 and the drive unit 112 are replaced with the determination unit 410 and the drive unit 420, respectively, and the reset unit 412 is added. In FIG. 8, the components denoted by the same reference signs as those in FIG. 2 have the same functions as and are configured similarly to those in FIG. 2. Therefore, description thereof will not be repeated and different points of the switching device 400 from the switching device 100 will be mainly described.

The determination unit 410 has a function of changing the level of a control signal S1 to be outputted, according to a reset signal S3 inputted from the reset unit 412 as described later, in addition to the same functions as those of the determination unit 110. In the first embodiment (see FIG. 2), the determination unit 110 determines whether or not a short-circuit has occurred, by using the one-way voltage V0 inputted from the first sensor 106, whereas the determination unit 410 determines whether or not a short-circuit has occurred, by using a measurement value (current value I0) of a current inputted from the first sensor 406 as described later. Specifically, the determination unit 410 compares the current value I0 with a negative threshold value Ith (<0), and outputs a control signal S1 according to the comparison result. For example, the determination unit 410 outputs an L level control signal S1 when I0>Ith, and outputs an H level control signal S1 when I0≤Ith.

When the determination unit 410 has outputted the control signal S1 at the H level, the determination unit 410 waits for an input of a reset signal S3 (e.g., H level) for a predetermined time Δt1. When the reset signal S3 has been inputted, the control signal S1 is changed to the L level. If the reset signal S3 is not inputted, the control signal S1 is maintained at the H level. As described later, when a short-circuit has occurred, the first sensor 406 repeatedly outputs the reset signal S3. When the determination unit 410 has changed the control signal S1 from the L level to the H level, for example, three times within a short period, the determination unit 410 maintains the control signal S1 at the H level even if a reset signal is inputted, and outputs a diagnostic signal S4 (e.g., H level). The diagnostic signal S4 is inputted to the external ECU 120.

The reset unit 412 outputs the reset signal S3 (H level) when a predetermined time Δt2 (Δt2<Δt1) has elapsed from when the control signal S1 outputted from the determination unit 410 became the H level. The elapse of time may be determined with a clock provided inside the reset unit 412, or by using time information acquired from the outside (a clock, etc.). Alternatively, an operation clock of the reset unit 412 may be used.

Like the first sensor 106, the first sensor 406 detects a voltage between the source S and the drain D of the semiconductor relay 104. Unlike the first sensor 106, the first sensor 406 calculates a current value I0 flowing through the semiconductor relay 104, based on the voltage Vs at the source S and the voltage Vd at the drain D. The first sensor 406 inputs the current value I0 into the determination unit 410. As a result, as described above, the first sensor 406 outputs the control signal S1 at a level according to the result of comparison between the current value I0 and the threshold value Ith.

The first drive unit 422 is a circuit for driving the semiconductor relay 104, and has the same function as the drive unit 112. The first drive unit 422 receives a control signal S1 from the determination unit 410, generates a drive signal Vg according to the control signal S1 and a control signal S2 inputted from the external ECU 120, and outputs the drive signal Vg to the semiconductor relay 104. When the control signal S1 is at the L level, a signal at the same level as the control signal S2 is outputted as the drive signal Vg. When the control signal S1 is at the H level, a signal at a level obtained by inverting the control signal S1 (i.e., a signal at the L level) is outputted as the drive signal Vg, regardless of the level of the control signal S2. The drive signal Vg is used as a signal (gate voltage) for controlling opening and closing of the semiconductor relay 104.

The second drive unit 424 is a circuit for driving the first switch 108a and the second switch 108b which constitute the switch unit 108. The second drive unit 424 controls opening and closing of the first switch 108a and the second switch 108b according to the control signal S2 from the external ECU 120.

(Operation when Short-Circuit has Occurred)

Figure 9:
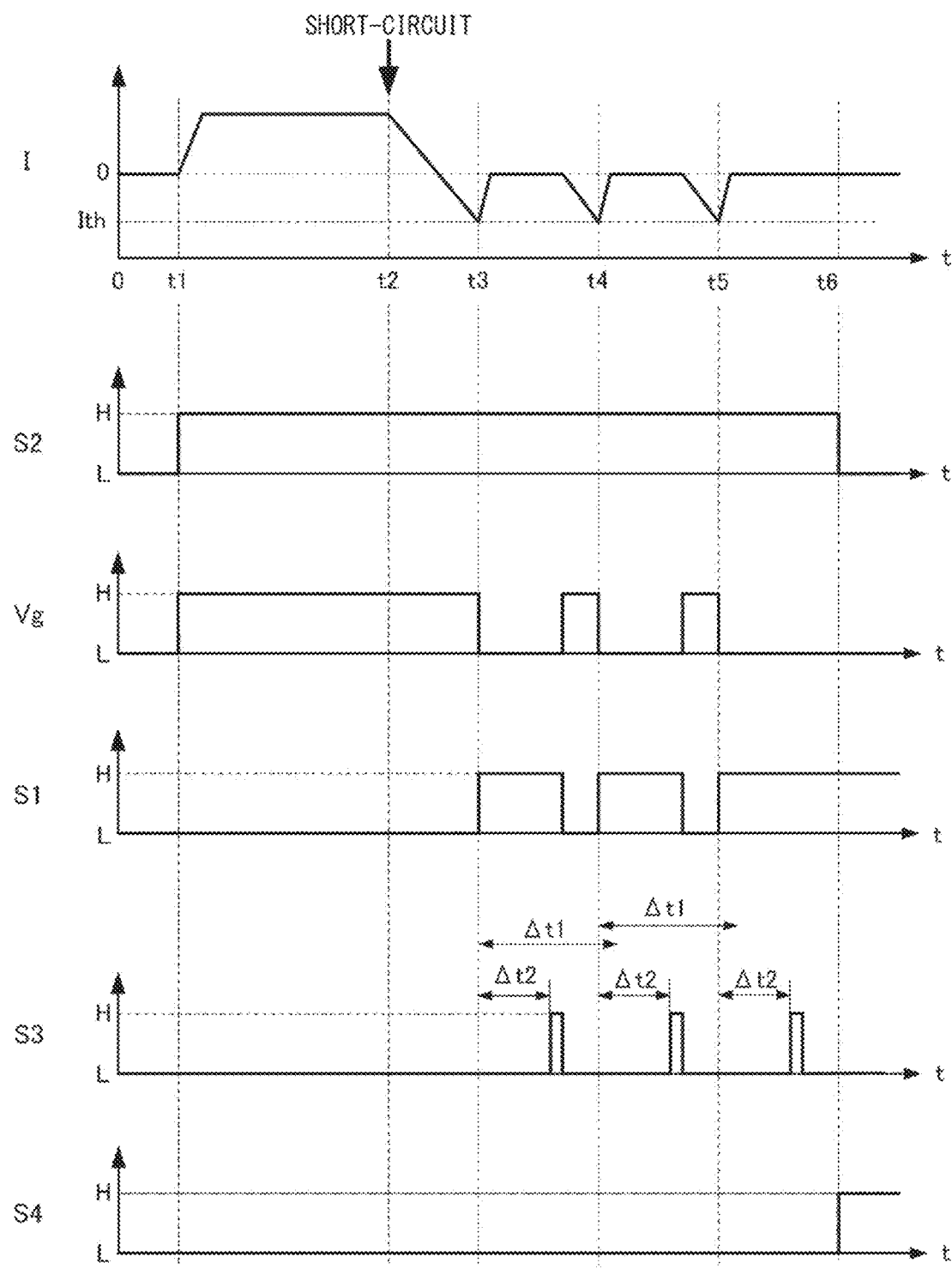
FIG. 9 is a timing chart showing an operation of the switching device shown in FIG. 8 (when a short-circuit occurs).

With reference to FIG. 9, an operation for detecting occurrence of a short-circuit will be described. Waveforms shown in FIG. 9 represents, from the top, the current I flowing through the semiconductor relay 104, the control signal S2 outputted from the external ECU 120, the drive signal Vg, the control signal S1 outputted from the determination unit 410, the reset signal S3, and the diagnostic signal S4. The drive signal Vg represents the state (on or off) of the semiconductor relay 104. The horizontal axis represents time t that is common to all the waveforms. The current I is a drain current, and is positive in a direction from the source S to the drain D of the semiconductor relay 104 (direction from the charger 200 to the storage battery 124). When I>0, the current I is a charging current for charging the storage battery 124. When I<0, the current I is a short-circuit current outputted from the storage battery 124.

During $0 \le t < t1$, the vehicle 140 stops, the control signal S2 is at the L level, and the switch unit 108 is in the open state. At this time, the current value I0 is 0, the control signal S1 outputted from the determination unit 410 is at the L level, and the first drive unit 422 outputs a signal at the same level (L level) as the control signal S2, as described above. Therefore, the semiconductor relay 104 is OFF (stopped state).

At $t=t1$, when quick charging is instructed, the external ECU 120 outputs the H level control signal S2, and the switch unit 108 is closed under the control of the second drive unit 424. The control signal S2 is also inputted to the first drive unit 422. At this time, the current value I0 outputted from the first sensor 106 is 0, and the control signal S1 outputted from the determination unit 410 is at the L level. Therefore, as described above, the first drive unit 422 outputs the drive signal Vg at the same level (H level) as the control signal S2. As a result, the semiconductor relay 104 is turned on, and quick charging is performed during $t1 < t < t2$.

It is assumed that a short-circuit occurs in the transmission path at $t=t3$ while the storage battery 124 is being charged. Then, the source voltage of the semiconductor relay 104 drops, and the current I decreases. Therefore, the current value I0 inputted from the first sensor 406 to the determination unit 410 decreases. When the source voltage of the semiconductor relay 104 further drops and becomes lower than the drain voltage, the direction of the current that flows through the channel of the semiconductor relay 104 is inverted (the current I changes from positive to negative), and the current further decreases. Therefore, the current value I0 inputted from the first sensor 406 to the determination unit 410 becomes negative, and further decreases. When the current value I0 becomes equal to or lower than the negative threshold value Ith (I0≤Ith), the determination unit 410 changes the control signal S1 from the L level to the H level (hereinafter also referred to as interruption control). Thus, the first drive unit 422 outputs the drive signal Vg at a level (L level) obtained by inverting the level (H level) of the control signal S1, regardless of the control signal S2 inputted from the external ECU 120. Therefore, the semiconductor relay 104 is turned off, and a channel current does not flow. Since the state where the drain voltage is higher than the source voltage is equivalent to the reversely biased state for the body diode, a current does not flow through the body diode. That is, the charging line (transmission path) is interrupted. In this state, the control signal S2 remains at the H level, and the switch unit 108 remains closed.

After the determination unit 410 has outputted the H level control signal S1, the determination unit 410 waits for an input of a reset signal S3 for a time Δt1. When the control signal S1 outputted from the determination unit 410 has become the H level, the reset unit 412 measures an elapsed time from when the control signal S1 became the H level, and when a time Δt2 has elapsed, outputs a reset signal S3 (H level). Upon receiving the reset signal S3, the determination unit 410 performs interruption control (changes the control signal S1 from the H level to the L level). As a result, the drive signal Vg becomes the H level, the semiconductor relay 104 is turned on, and the current I starts to flow. However, since the short-circuit is present, the current I is a short-circuit current, and therefore, after a short time, at $t=t4$, becomes the same state as that at $t=t3$. That is, the control signal S1 is at the H level, the drive signal Vg is at the L level, and the semiconductor relay 104 is turned off.

During $t4 < t \le t5$, the above-described operation during $t3 < t \le t4$ is repeated. As a result, the determination unit 410 sets the control signal S1 to the H level, three times in total at $t=t3$, t4, and t5 (three times of interruption control). Thereafter, the determination unit 410 maintains the control signal S1 at the H level even if the reset signal is inputted, and at $t=t6$, outputs a diagnostic signal S4 (H level). The diagnostic signal S4 is inputted to the external ECU 120, and the external ECU 120 sets the control signal S2 to the L level. Thus, the second drive unit 424 opens the first switch 108a and the second switch 108b.

(Operation at Erroneous Detection of Short-Circuit)

Figure 10:
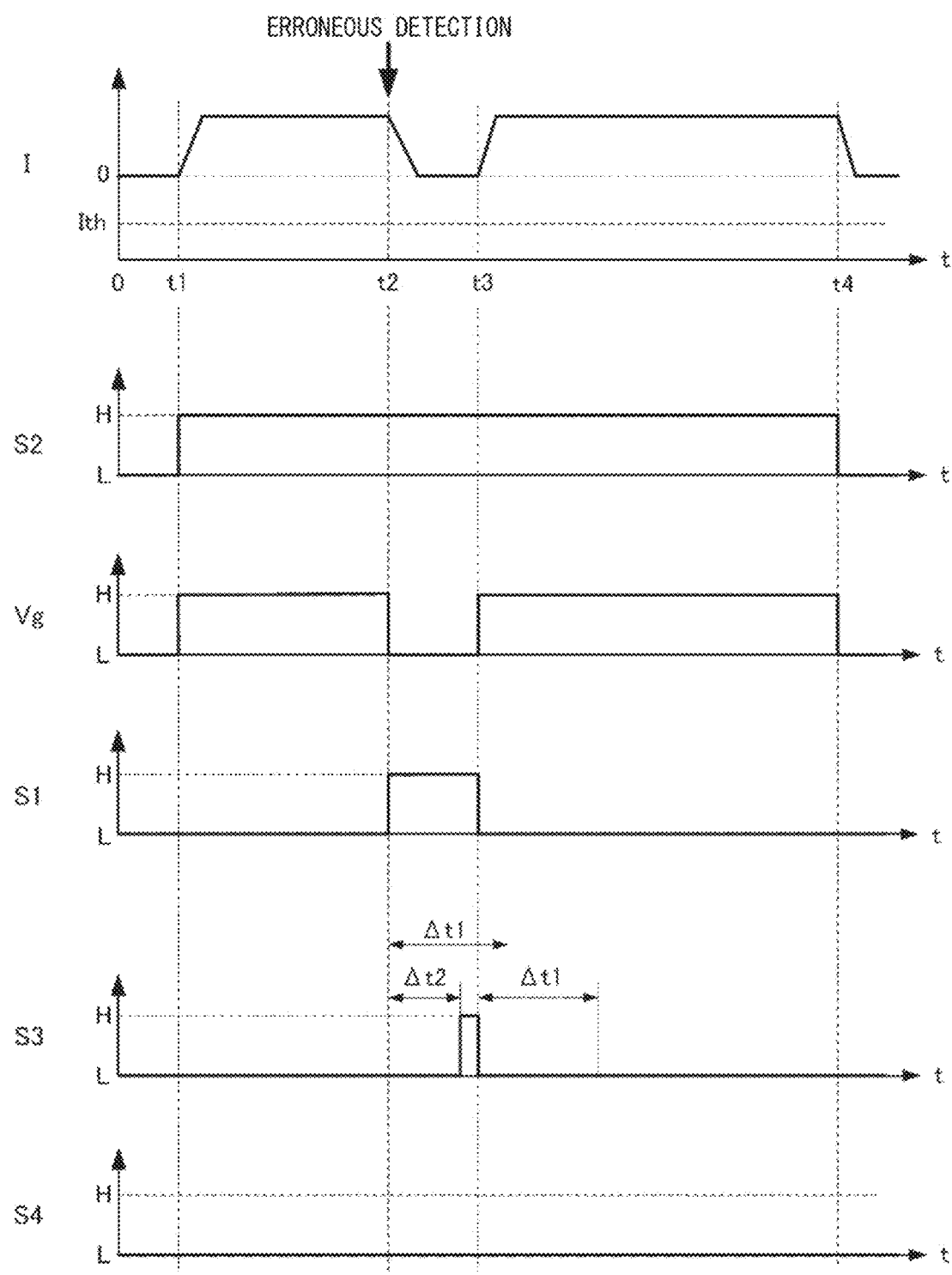
FIG. 10 is a timing chart showing an operation of the switching device shown in FIG. 8 (when erroneous detection of a short-circuit occurs).

With reference FIG. 10, an operation when detection of occurrence of a short-circuit is erroneous detection will be described. The meaning of each waveform shown in FIG. 10 is the same as that in FIG. 9, and the meaning of the horizontal axis is also the same as that in FIG. 9.

During $0 \le t < t2$, the operation of the switching device 400 is the same as that shown in FIG. 9. During $t1 \le t < t2$, quick charging is performed.

It is assumed that occurrence of a short-circuit is erroneously detected at $t=t2$ for some reason while the storage battery 124 is being charged. For example, if the current value I0 outputted from the first sensor 406 has become equal to or lower than the threshold value Ith (I0≤Ith) although a short-circuit does not actually occur and a charging current normally flows, the determination unit 410 changes the control signal S1 from the L level to the H level. As a result, the drive voltage Vg becomes the L level, and the semiconductor relay 104 is turned off. A reset signal S3 is outputted from the first sensor 406 during the time Δt1 in which the determination unit 410, which has outputted the H level control signal S1, waits for an input of the reset signal S3.

Upon receiving the inputted reset signal S3, the determination unit 410 returns the control signal S1 to the L level at t=t3. Thus, the drive signal Vg becomes the H level, and the semiconductor relay 104 is turned on. The determination unit 410, which has outputted the H level control signal S1, waits for an input of the reset signal S3 for the time Δt1, but the reset signal S3 is not outputted because a short-circuit does not actually occur, i.e., erroneous detection is made, and a short-circuit current does not flow (I0>Ith). Therefore, quick charging is continued thereafter, and when the storage battery 124 is fully charged at t=t4, for example, the external ECU 120 changes the control signal S2 to the L level, and the semiconductor relay 104 is turned off. This is the end of the quick charging.

As described above, when a short-circuit has actually occurred in the transmission path on the charger 200 side with respect to the semiconductor relay 104 (on the left side of the semiconductor relay 104), the switching device 400 mounted in the vehicle 140 turns off (opens) the semiconductor relay 104 to promptly interrupt the transmission path, thereby preventing a short-circuit current from flowing from the storage battery 124. After performing interruption control three times (after changing the control signal S1 to the H level three times), the determination unit 410 determines that a short-circuit has occurred, and thus occurrence of the short-circuit can be detected more accurately. Moreover, if detection of occurrence of a short-circuit is erroneous detection, quick charging can be continued without stopping the same.

In the above description, the determination unit 410 determines that a short-circuit has occurred, after performing interruption control three times. However, the present disclosure is not limited thereto. In order to avoid erroneous detection, the determination unit 410 only needs to perform interruption control two or more times within a predetermined short period. The determination unit 410 may determine that a short-circuit has occurred, after performing interruption control four or more times.

In the above description, the first sensor 406 measures the current value of the semiconductor relay 104. However, the present disclosure is not limited thereto. Like the first sensor 106 of the first embodiment, the first sensor 406 may measure a voltage and output a one-way voltage V0. In this case, like the determination unit 110, the determination unit 410 compares the one-way voltage V0 with the threshold value Vth to determine whether or not a short-circuit has occurred.

Third Embodiment

In the second embodiment, erroneous detection of a short-circuit is dealt with, but the semiconductor relay itself may fail. In the third embodiment, a short-circuit current can be interrupted and erroneous detection of a short-circuit can be dealt with as in the second embodiment, and moreover, a failure of the semiconductor relay can also be detected.
(Configuration)

Figure 11:
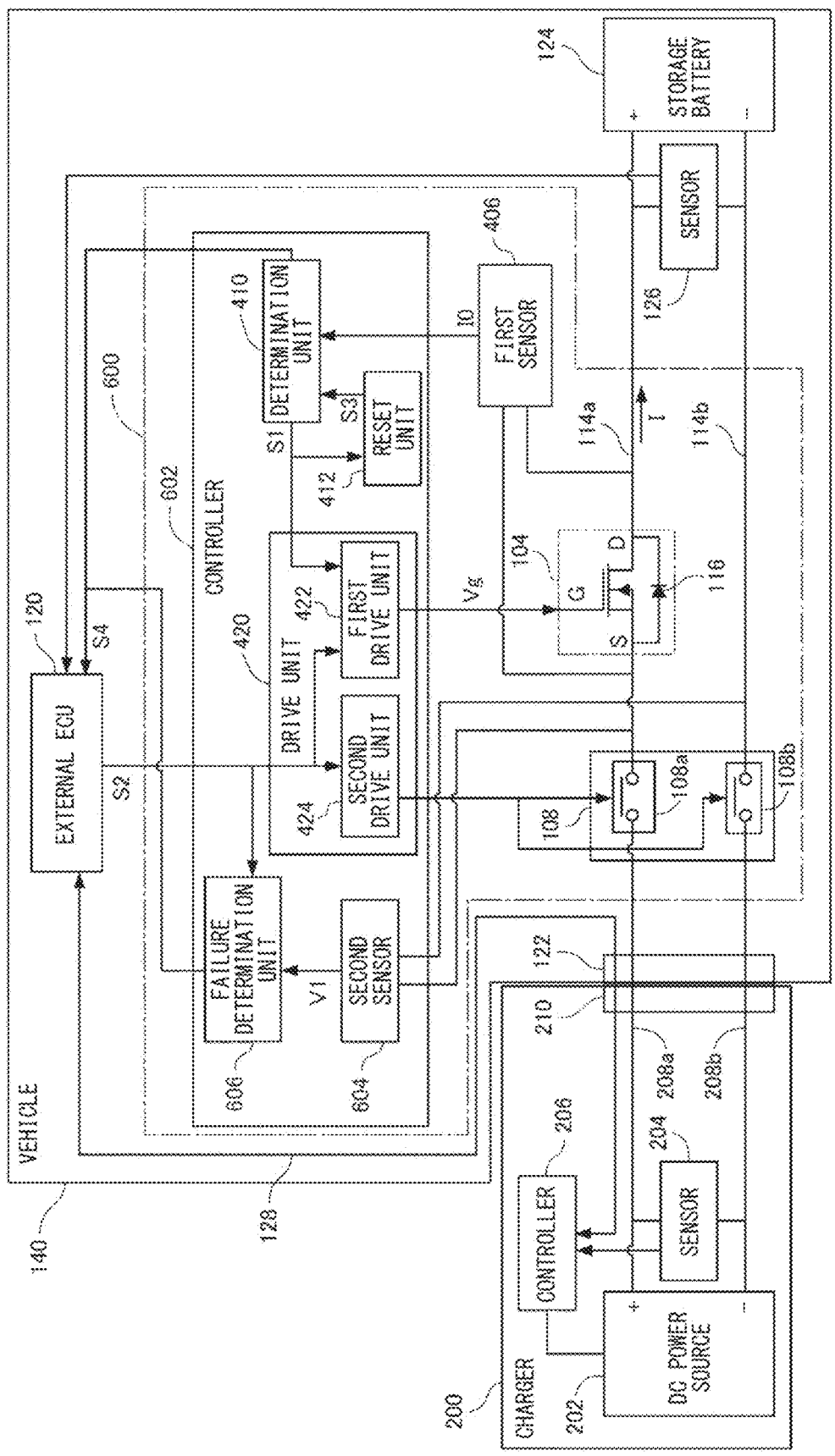
FIG. 11 is a block diagram showing a configuration of a switching device according to a third embodiment of the present disclosure.

With reference to FIG. 11, a switching device 600 according to the third embodiment of the present disclosure includes a controller 602, a semiconductor relay 104, a first sensor 106, a switch unit 108, and transmission paths 114a and 114b. The switching device 600 is mounted in a vehicle 140 together with an external ECU 120, a connector 122, a storage battery 124, and a sensor 126. The switching device 600 is disposed on the transmission paths that connect the charger 200 to the vehicle 140 to charge the storage battery 124.

The controller 602 includes a determination unit 410, a reset unit 412, a drive unit 420, a second sensor 604, and a failure determination unit 606. The drive unit 420 includes a first drive unit 422 and a second drive unit 424. The switching device 600 is identical to the switching device 400 shown in FIG. 8 except that the controller 402 is replaced with the controller 602. The controller 602 is identical to the controller 402 shown in FIG. 8 except that the second sensor 604 and the failure determination unit 606 are added. In FIG. 11, the components denoted by the same reference signs as those in FIG. 8 have the same functions as and are configured similarly to those in FIG. 8. Hereinafter, description thereof will not be repeated and different points of the switching device 600 from the switching device 400 will be mainly described.

The second sensor 604 detects a voltage at a connection node between the switch unit 108 and the semiconductor relay 104, and outputs a detection result (voltage value V1) to the failure determination unit 606. Specifically, the second sensor 604 measures a voltage between a connection node of the first switch 108a and the semiconductor relay 104 (source S) which are disposed on the transmission path 114a, and a connection node of the second switch 108b and the storage battery 124 (negative terminal) which are disposed on the transmission path 114b.

The failure determination unit 606 determines presence/absence of a failure of the semiconductor relay 104 and the type of the failure, based on the control signal S2 inputted from the external ECU 120 and the voltage value V1 inputted from the second sensor 604. Specifically, when the control signal S2 is at the L level, the failure determination unit 606 determines that the semiconductor relay 104 is normal if the voltage value V1 is at an L level lower than a predetermined threshold value Vth2 (V1<Vth2), and determines that the semiconductor relay 104 is in failure if the voltage value V1 is at an H level equal to or higher than the threshold value Vth2 (V1≥Vth2). The failure determination unit 606 determines the type of the failure to be a failure in which the semiconductor relay 104 is ON although the drive signal Vg is at the L level (hereinafter referred to as "stuck-ON failure"). Meanwhile, when the control signal S2 is at the H level, the failure determination unit 606 determines that the semiconductor relay 104 is normal if the voltage value V1 is at the H level, and determines that the semiconductor relay 104 is in failure if the voltage value V1 is at the L level (V1<Vth2). The failure determination unit 606 determines the type of the failure to be a failure in which the semiconductor relay 104 is OFF although the drive signal Vg is at the H level (hereinafter referred to as "stuck-OFF failure"). The threshold value Vth2 is ½ of the voltage of the storage battery 124, for example.

Figure 12:
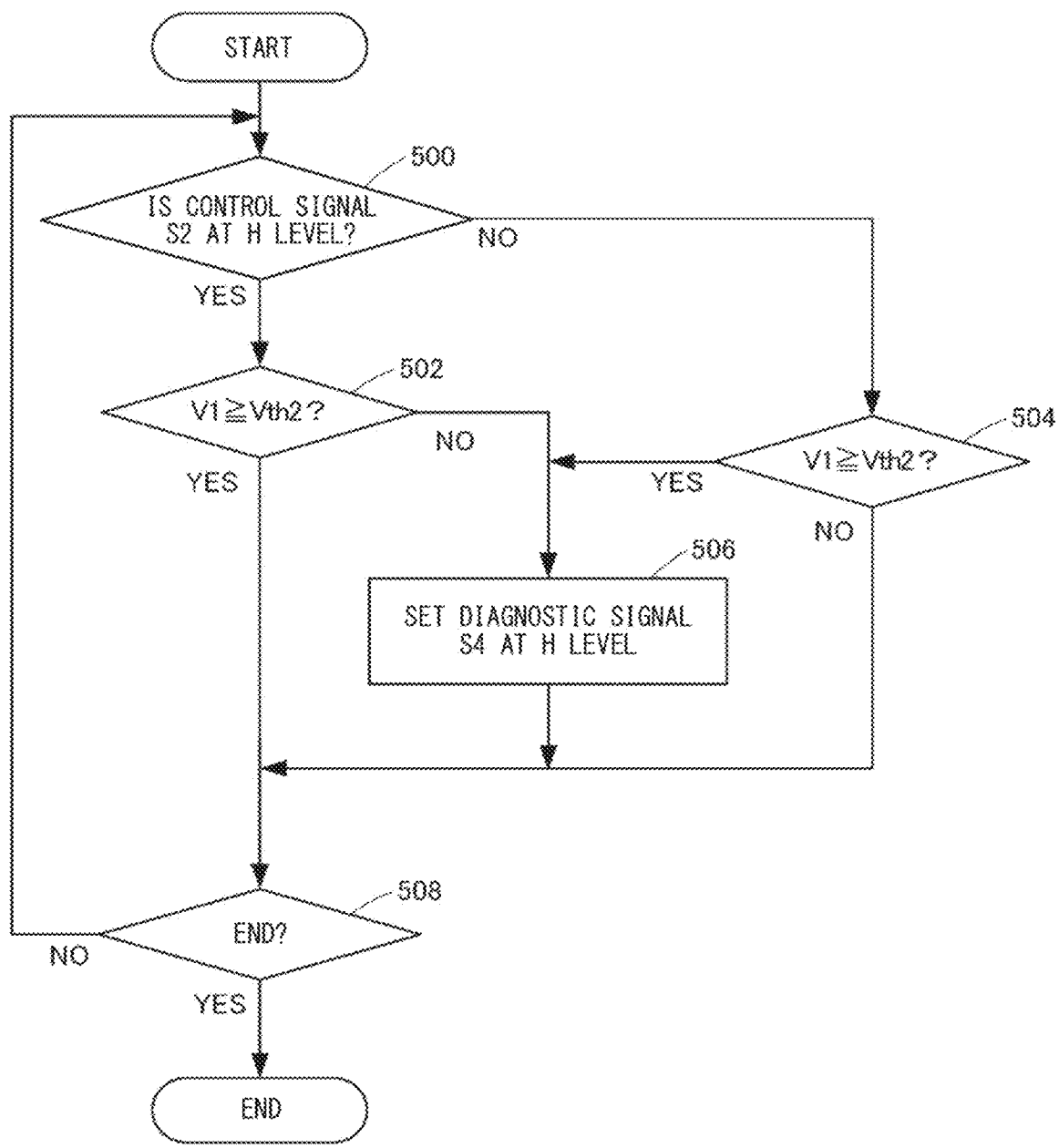
FIG. 12 is a flowchart showing an operation of a failure determination unit of the switching device shown in FIG. 11.

The failure determination unit 606 can be implemented by an arithmetic element (IC chip such as ASIC, FPGA, etc.) having a relatively simple configuration. The failure determination unit 606 may be implemented by a CPU, a microcomputer, or the like. FIG. 12 shows an example of the operation of the failure determination unit 606. The charger 200 starts and stops outputting of power, upon receiving an instruction from the vehicle 140 side. Specifically, the controller 206 discharges the DC power source 202 upon receiving an instruction to start charging from the external ECU 120 through the communication line 128, and stops the discharging upon receiving an instruction to stop charging.

In step 500, the failure determination unit 606 determines whether or not the control signal S2 inputted from the external ECU 120 is at the H level. When the determination result is that the control signal S2 is at the H level, the control proceeds to step 502. Otherwise, the control proceeds to step 504.

In step 502, the failure determination unit 606 determines whether or not the voltage value V1 inputted from the second sensor 604 is equal to or higher than the threshold value Vth2. When the determination result is that the voltage value V1 is equal to or higher than the threshold value Vth2 (the semiconductor relay 104 is normal), the control proceeds to step 508. Otherwise, that is, when V1<Vth2 (the semiconductor relay 104 is in the stuck-OFF state), the control proceeds to step 506.

In step 504, as in step 502, the failure determination unit 606 determines whether or not the voltage value V1 is equal to or higher than the threshold value Vth2. When the determination result is that the voltage value VI is equal to or higher than the threshold value Vth2 (the semiconductor relay 104 is in the stuck-ON state), the control proceeds to step 506. Otherwise (the semiconductor relay 104 is normal), the control proceeds to step 508.

In step 506, the failure determination unit 606 sets a diagnostic signal S4 to be outputted to the external ECU 120, to the H level. Thereafter, the control proceeds to step 508.

In step 508, the failure determination unit 606 determines whether or not an end instruction has been received. When the determination result is that an end instruction has been received, the failure determination unit 606 stops the operation. Otherwise, the control returns to step 500. For example, when a power-off instruction has been made through an operation on the operation device of the vehicle 140, the failure determination unit 606 determines that an end instruction has been received.

As described above, the failure determination unit 606 determines presence/absence of a failure of the semiconductor relay 104 and the type of the failure, according to the control signal S2 and the voltage value V1, and when a failure is present, outputs the H level diagnostic signal S4 to the external ECU 120. When the semiconductor relay 104 is in the stuck-ON state, even if a short-circuit occurs and the switching device 600 detects the short-circuit, a short-circuit current cannot be interrupted. Meanwhile, when the semiconductor relay 104 is in the stuck-OFF state, power is applied to the body diode of the semiconductor relay 104 during quick charging, which may cause heat to be generated more than expected. Therefore, it is preferable to detect the stuck-ON state and the stuck-OFF state.

As described above, when determining that the semiconductor relay 104 is in failure, the failure determination unit 606 outputs the diagnostic signal S4 to the external ECU 120. The external ECU 120 does not instruct the controller 206 to start charging even if it has outputted the H level control signal S2 in response to an instruction for quick charging. The external ECU 120 may set the control signal S2 to the L level. If the external ECU 120 has outputted the L level control signal S2, the external ECU 120 does not set the control signal S2 to the H level even if it receives an instruction for quick charging, but maintains the control signal S2 at the L level. In either case, the external ECU 120 may present a warning.

(Normal Operation)

Figure 13:
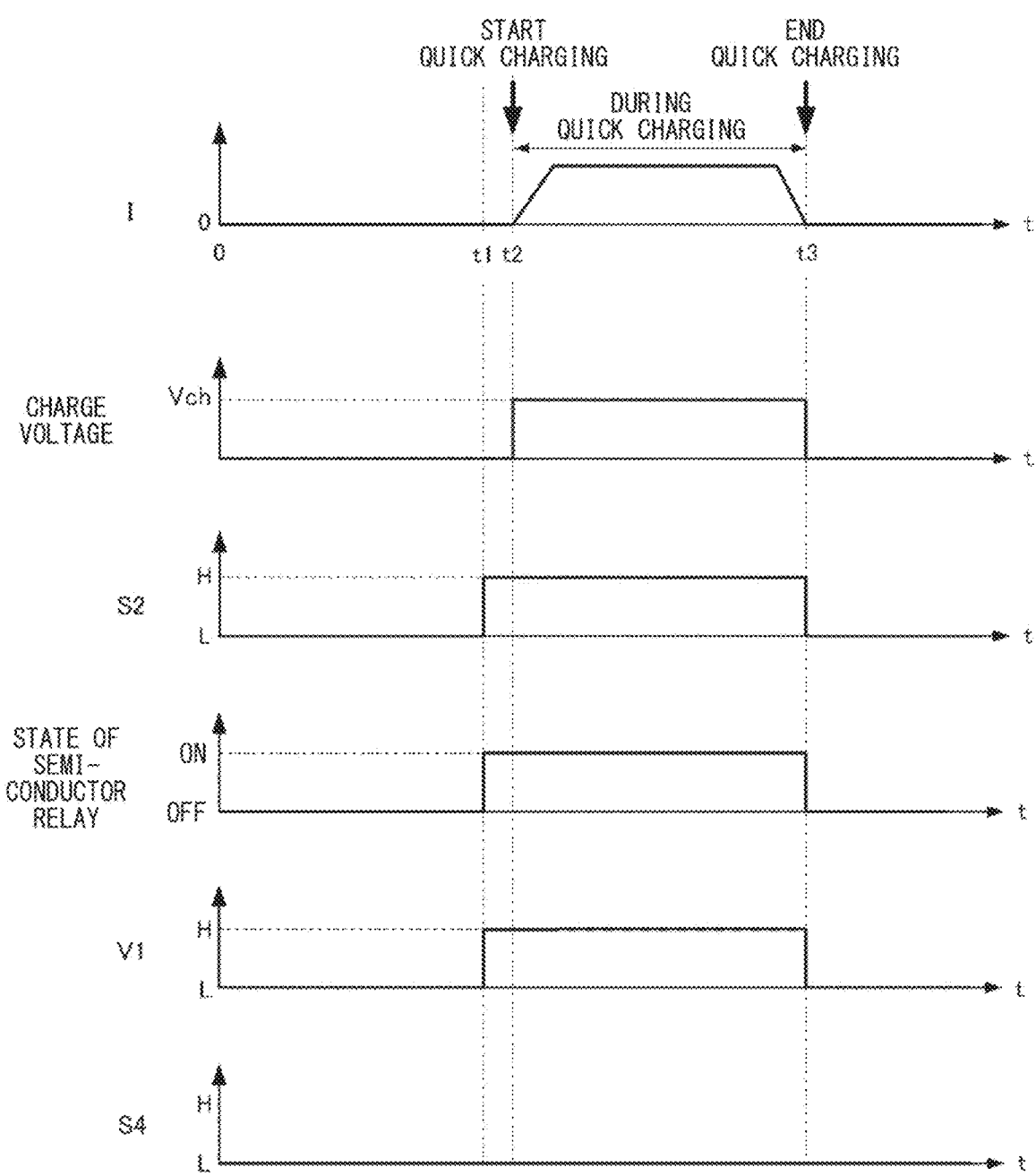
FIG. 13 is a timing chart showing an operation of the switching device shown in FIG. 11 (normal state).

With reference to FIG. 13, an operation of the semiconductor relay 104 during quick charging when the semiconductor relay is normal, will be described. Waveforms shown in FIG. 13 represent, from the top, the current I flowing through the semiconductor relay 104, a charge voltage (output voltage of the charger 200), the control signal S2 outputted from the external ECU 120, the state of the semiconductor relay 104, the voltage value V1 outputted from the second sensor 604, and the diagnostic signal S4. The horizontal axis represents time t that is common to all the waveforms. Here, it is assumed that a short-circuit does not occur. When the semiconductor relay 104 is normal, the ON/OFF state of the semiconductor relay 104 is determined based on the level of the drive signal Vg. However, when the semiconductor relay 104 is in failure, the ON/OFF state of the semiconductor relay 104 is not directly related to the level of the drive signal Vg. When a short-circuit has occurred, the switching device 600 operates similarly to the switching device 400 (see FIG. 9 to FIG. 10).

At t=t1, when quick charging has been instructed, the external ECU 120 outputs the H level control signal S2, and the switch unit 108 is closed under the control of the second drive unit 424. The control signal S2 is also inputted to the first drive unit 422. In this stage, the external ECU 120 has not yet instructed the controller 206 to start charging, a charge voltage is not outputted from the charger 200, the current value I0 outputted from the first sensor 106 is 0, and the control signal S1 outputted from the determination unit 410 is at the L level. Therefore, the first drive unit 422 outputs a drive signal Vg at the same level (H level) as the control signal S2. As a result, the semiconductor relay 104 is turned on, the voltage of the storage battery 124 is detected by the second sensor 604, and the voltage value V1 outputted from the second sensor 604 becomes the H level. Therefore, the diagnostic signal S4 is maintained at the L level, and at time t2, the external ECU 120 instructs the controller 206 of the charger 200 to start charging. As a result, the voltage Vch is supplied from the charger 200, and quick charging is performed during t2<t<t3.

Thereafter, the quick charging is continued. When the storage battery 124 is fully charged at t=t3, the external ECU 120 instructs the controller 206 to stop charging, and sets the control signal S2 to the L level. As a result, the charge voltage becomes zero, the semiconductor relay 104 is turned off, and the quick charging is ended.

(Operation in Stuck-ON State)

Figure 14:
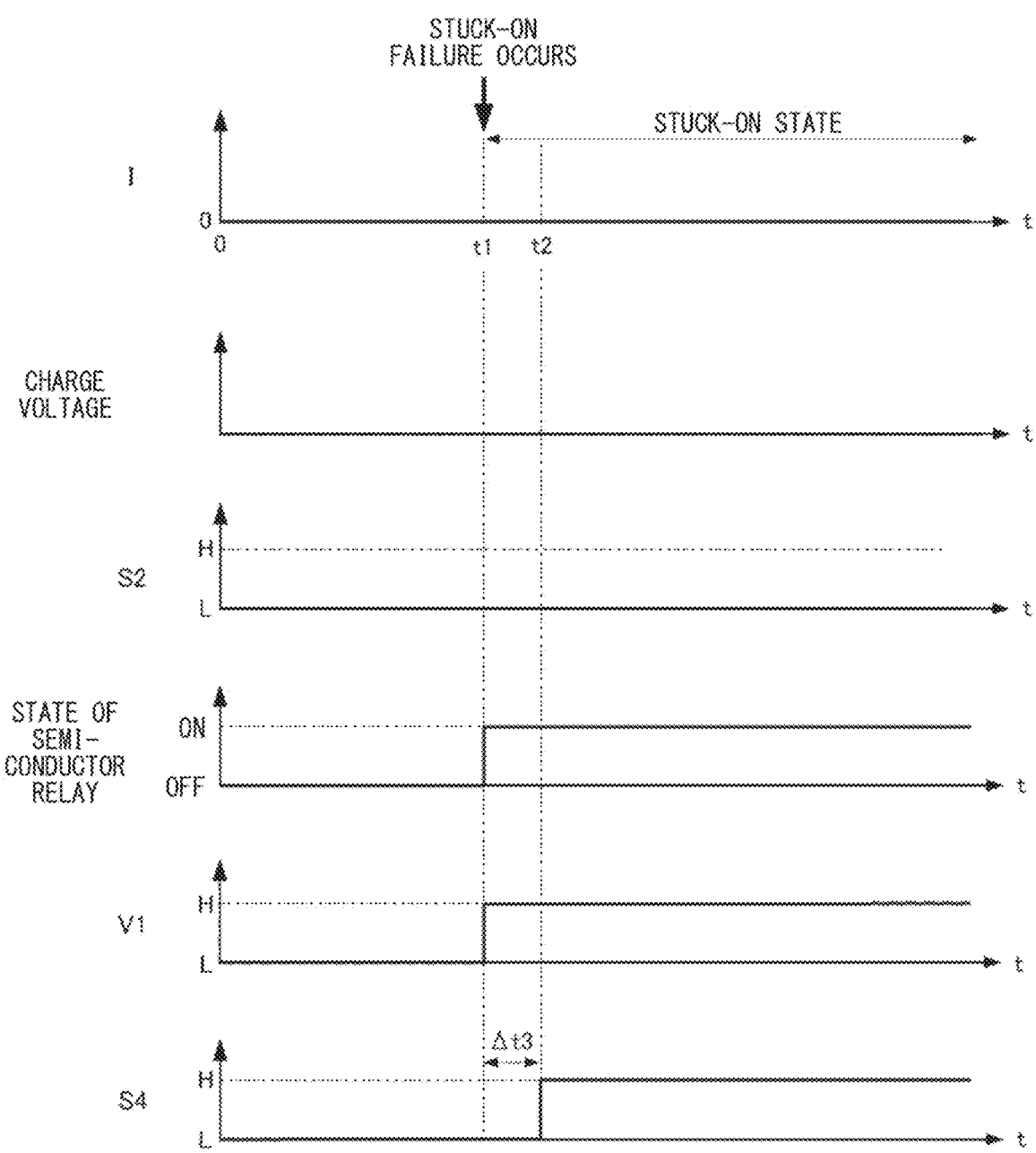
FIG. 14 is a timing chart showing an operation of the switching device shown in FIG. 11 (semiconductor relay in stuck-ON state).

With reference to FIG. 14, an operation of the semiconductor relay 104 during quick charging when the semiconductor relay 104 is in the stuck-ON state, will be described. The meaning of each waveform shown in FIG. 14 is the same as that in FIG. 13, and the meaning of the horizontal axis is also the same. It is assumed that quick charging is not executed.

If the semiconductor relay 104 has entered the stuck-ON state for some reason at time t=t1, the voltage of the storage battery 124 (voltage at the positive terminal) is applied to a connection node of the first switch 108a and the semiconductor relay 104. Therefore, the voltage value V1 outputted from the second sensor 604 becomes the H level. In response to this, since the control signal S2 is at the L level, the failure determination unit 606 determines whether or not the voltage value V1 from the second sensor 604 is maintained at the H level for a predetermined time Δt3. Since the voltage value V1 remains at the H level even when the time Δt3 has elapsed, the failure determination unit 606 sets the diagnostic signal S4 to the H level at t=t2. In response to this, the external ECU 120 maintains the control signal S2 at the L level (does not set the control signal S2 to the H level even when receiving an instruction for quick charging). Therefore, execution of quick charging is prevented when the semiconductor relay 104 is in the stuck-ON state. That the semiconductor relay 104 is in the stuck-ON state can be presented by the external ECU 120.

(Operation in Stuck-OFF State)

Figure 15:
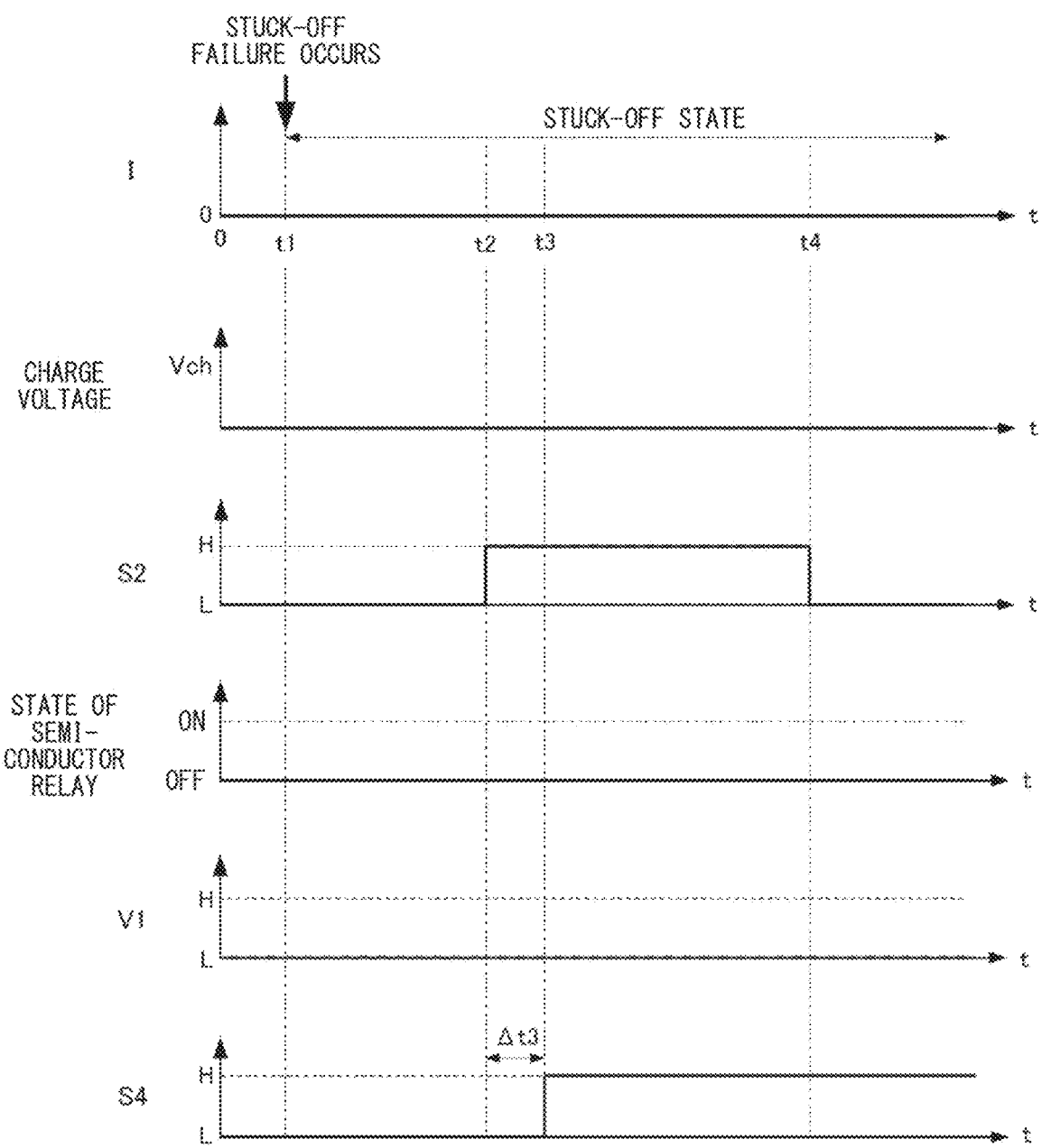
FIG. 15 is a timing chart showing an operation of the switching device shown in FIG. 11 (semiconductor relay in stuck-OFF state).

With reference to FIG. 15, an operation of the semiconductor relay 104 when quick charging is instructed when the semiconductor relay is in the stuck-OFF state, will be described. The meaning of each waveform shown in FIG. 15 is the same as that in FIG. 13, and the meaning of the horizontal axis is also the same.

It is assumed that, at t=t1, the semiconductor relay 104 has entered the stuck-OFF state for some reason. Although the processing shown in FIG. 12 is performed even in this case, since quick charging is not performed and both the control signal S2 and the voltage value V1 are at the L level, a failure (stuck-OFF failure) is not detected. When quick charging is instructed at t=t2, the external ECU 120 sets the control signal S2 to the H level, whereby the drive voltage Vg becomes the H level. However, since the semiconductor relay 104 is in the stuck-OFF state and the external ECU 120 has not yet instructed the controller 206 to start charging, a charge voltage is not outputted. Therefore, the voltage value V1 outputted from the second sensor 604 remains at the L level. The failure determination unit 606 determines whether or not the voltage value V1 from the second sensor 604 is maintained at the L level for the time Δt3 from when the control signal S2 has become the H level. Since the voltage value V1 does not become the H level but remains at the L level even when the time Δt3 has elapsed, the failure determination unit 606 sets the diagnostic signal S4 to the H level at t=t3. In response to this, the external ECU 120 does not instruct the controller 206 of the charger 200 to start charging although it has received an instruction for quick charging. Furthermore, the external ECU 120 returns the control signal S2 from the H level to the L level at t=t4. That the semiconductor relay 104 is in the stuck-OFF state can be presented by the external ECU 120.

As described above, when the semiconductor relay 104 is in failure, the switching device 600 can prevent execution of quick charging even if there is an instruction for quick charging. Therefore, when the semiconductor relay 104 is in stuck-OFF failure, it is possible to avoid the situation that power is applied to the body diode of the semiconductor relay 104 during quick charging and heat is generated more than expected. Meanwhile, when the semiconductor relay 104 is in stuck-ON failure, since this failure can be presented, the semiconductor relay 104 can be promptly replaced. Therefore, when the semiconductor relay 104 is in the stuck-ON state, it is possible to avoid the problem that, even if a short-circuit occurs and the switching device 600 detects the short-circuit, a short-circuit current cannot be interrupted.

As long as the semiconductor relay 104 is normal, the switching device 600 operates in the same manner as the switching device 400. That is, when a short-circuit has occurred, the transmission path is promptly interrupted by turning off (opening) the semiconductor relay 104, thereby preventing a short-circuit current from flowing from the storage battery 124. In addition, if detection of occurrence of the short-circuit is erroneous detection, quick charging can be continued without stopping.

In the above description, the second sensor 604 and the failure determination unit 606 are included in the controller 602. However, the present disclosure is not limited thereto. The second sensor 604 and the failure determination unit 606 may be disposed outside the controller 602.

In the above description, the external ECU 120 instructs the controller 206 of the charger 200 to start and stop quick charging. However, the present disclosure is not limited thereto. When the connectors 210 and 122 are connected to each other and the first switch 108a is ON, the controller 206 can detect a voltage value corresponding to the voltage value V1 by using a predetermined pin, among pins of the connector 210, which is connected to the first switch 108a. Therefore, the controller 206 may determine start and stop of power supply, according to the voltage of the predetermined pin of the connector 210. In this case, if the voltage of the predetermined pin remains zero (the voltage of the storage battery 124 cannot be detected) even though the failure determination unit 606 does not detect a failure of the semiconductor relay 104 and the semiconductor relay 104 is ON, it is possible to determine that the switch unit 108 is in failure.

(Modifications)

Figure 16:
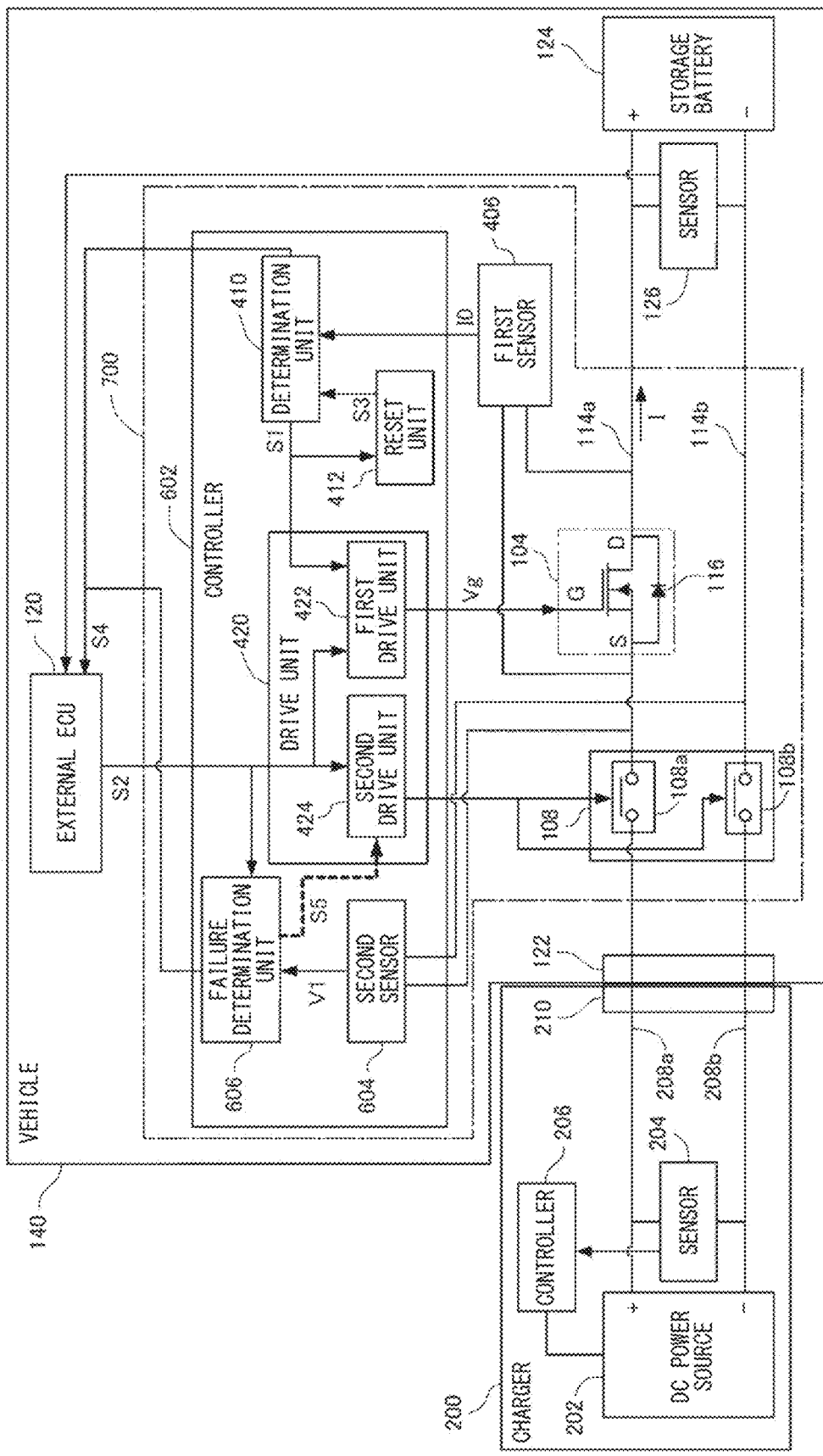
FIG. 16 is a block diagram showing a configuration of a switching device according to a modification.

In the third embodiment, when a failure occurs in the semiconductor relay 104, the H level diagnostic signal S4 is outputted from the failure determination unit 606 to the external ECU 120. However, the present disclosure is not limited thereto. A switching device according to a modification outputs the H level diagnostic signal S4 from the failure determination unit 606 to the external ECU 120, and opens the switch unit 108. With reference to FIG. 16, a switching device 700 according to this modification is identical to the switching device 600 shown in FIG. 12 except that a signal line from the failure determination unit 606 to the second drive unit 424 is added as shown by a broken line. The other components of the switching device 700 are the same as those of the switching device 600.

When outputting the diagnostic signal S4, the failure determination unit 606 in the switching device 700 outputs, for example, an H level control signal S5 to the second drive unit 424. Upon receiving this signal, the second drive unit 424 controls the switch unit 108 to the open state, regardless of the level of the control signal S2. Therefore, when it is detected that a failure occurs in the semiconductor relay 104, the switch unit 108 can be promptly opened. Therefore, it is possible to avoid the problem that a short-circuit current cannot be interrupted when a short-circuit occurs, due to a failure of the semiconductor relay 104.

In the above description, when the control signal S2 is at the H level, the switch unit 108 is closed. However, the present disclosure is not limited thereto. The level of the control signal S2 at which the switch unit 108 is opened and the level of the control signal S2 at which the switch unit 108 is closed only need to be different from each other. For example, the switch unit 108 may be configured to be closed when the control signal S2 is at the L level. In this case, in the state where the control signal S1 is at the L level (no short-circuit occurs), the drive unit 112 only needs to output, to the gate G of the semiconductor relay 104, the drive signal Vg at a level (H level) obtained by inverting the control signal S2 (L level) to be inputted.

In the above description, the determination unit 110 outputs the H level control signal S1 when V0≥Vth, and outputs the L level control signal S1 when V0<Vth. However, the present disclosure is not limited thereto. The determination unit 110 only needs to output the control signal S1 at different levels according to whether or not V0≥Vth. For example, the determination unit 110 may output an L level control signal S1 when V0≥Vth, and output an H level control signal S1 when V0<Vth. In this case, when the control signal S1 is at the H level, the drive unit 112 may output the drive signal Vg at the same level as the control signal S2 to be inputted (or a level obtained by inverting the control signal S2), and when the control signal S1 is at the L level, the drive unit 112 may output the drive signal Vg at the same level (L level) as the control signal S1. As a result, when the transmission path is short-circuited, the transmission path can be interrupted by setting the gate G of the semiconductor relay 104 to the L level. The same applies to the process of outputting the control signal S1 according to the result of comparison performed between the current value I0 and the threshold value Ith by the determination unit 410. The determination unit 410 only needs to be configured to output the control signal S1 at different levels according to whether or not I0≤Ith.

In the above description, the semiconductor relay 104 is disposed between the storage battery 124 (positive terminal) and the first switch 108a. However, the present disclosure is not limited thereto. The semiconductor relay 104 may be disposed between the storage battery 124 and the second switch 108b. In this case, the drain D of the semiconductor relay 104 is connected to the second switch 108b, and the source S is connected to the negative terminal of the storage battery 124.

In the above description, an N-MOSFET is used as the semiconductor relay 104. However, the present disclosure is not limited thereto. A P-type MOSFET (hereinafter referred to as "P-MOSFET") may be used as the semiconductor relay 104. In this case, for example, the source S of the semiconductor relay (P-MOSFET) is connected to the positive terminal of the storage battery 124, the drain D is connected to the first switch 108a, and a negative voltage is applied to the gate G, with the voltage at the source S as a reference. As for a body diode formed in the P-MOSFET, a direction from the drain to the source (direction from the first switch 108a to the positive terminal of the storage battery 124) is a forward direction of the body diode. Therefore, as in the case of using the N-MOSFET as the semiconductor relay 104, a short-circuit current can be prevented even when a short-circuit has occurred in the transmission path.

In the above description, a MOSFET is used as the semiconductor relay. However, the present disclosure is not limited thereto. Any element may be used as long as the element functions as a switch while being externally controlled, is small in ON resistance, and functions as a diode when being off. For example, a semiconductor relay using a thyristor, a triac, or the like may be adopted. Alternatively, an element that functions as a switch while being externally controlled and is small in ON resistance may be connected to a diode in parallel. The semiconductor relay configured as described above is disposed on a transmission line such that an anode of a diode is connected to the charger side while a cathode of the diode is connected to the storage battery side, whereby a short-circuit current can be prevented when a short-circuit occurs in the transmission path.

While the present disclosure has been described through description of embodiments above, the above embodiments are merely illustrative and the present disclosure is not limited to only the above embodiments. The scope of the present disclosure is defined by each claim of the scope of claims with reference to the above description, and includes meanings equivalent to the wordings described therein and all modifications within the scope of claims.

REFERENCE SIGNS LIST 12 electric motor vehicle
14 quick charger
24 battery for traveling
28n, 28p charging line switch
30 vehicle-side connector
32, 116 diode
34 bypass line switch
36 resistance element
38 vehicle-side voltage sensor
40 electronic control unit
46n, 46p vehicle-side charging line
48 bypass line
60, 202 DC power source
62 charger-side connector
66 charger-side voltage sensor
72n, 72p charger-side charging line
100, 400, 600, 700 switching device
102, 206, 402, 602 controller
104 semiconductor relay
106, 406 first sensor
108 switch unit
108a first switch
108b second switch
110, 410 determination unit
112, 420 drive unit
114a, 114b, 208a, 208b transmission path
120 external ECU
122, 210 connector
124 storage battery
126, 204 sensor
128 communication line
140 vehicle
200 charger
300, 302, 304, 306, 308, 310, 312, 500, 502, 504, 506, 508 step
412 reset unit
422 first drive unit
424 second drive unit
604 second sensor
606 failure determination unit
D drain
G gate
I current
I0 current value
ID drain current
V0 one-way voltage
V1 voltage value
VD drain voltage
VG gate voltage
Vg drive signal
S source
S1, S2, S5 control signal
S3 reset signal
S4 diagnostic signal
Δt1, Δt2, Δt3 time

The invention claimed is:

1. A switching device mounted in a vehicle and disposed between a connector connected to a DC power source, and a storage battery, the switching device comprising:
   a transmission path connecting the connector and the storage battery;
   a semiconductor relay disposed on the transmission path,
   a switch disposed on the transmission path;
   a first sensor configured to measure a current flowing through the semiconductor relay, or a voltage of the semiconductor relay; and
   a controller configured to control opening and closing of the semiconductor relay, wherein
   the switch is controlled by an external control signal, the controller controls the semiconductor relay, based on the control signal and a measurement value of the first sensor, and in a state where the transmission path is not short-circuited, the controller performs a synchronization control to control opening and closing of the semiconductor relay in synchronization with opening and closing of the switch.

2. The switching device according to claim 1, wherein the controller includes a determination unit configured to determine presence/absence of a short-circuit of the transmission path, based on the measurement value of the first sensor, and controls opening and closing of the semiconductor relay, based on the control signal and a determination result of the determination unit.

3. The switching device according to claim 2, wherein the first sensor includes a voltage sensor, the voltage sensor measures a voltage between an input terminal and an output terminal of the semiconductor relay, and the determination unit determines presence/absence of a short-circuit of the transmission path, based on the voltage measured by the voltage sensor.

4. The switching device according to claim 2, wherein in response to the determination unit having determined that the transmission path is short-circuited, the controller performs opening/closing control for the semiconductor relay without considering the control signal.

5. The switching device according to claim 4, wherein the opening/closing control for the semiconductor relay is an interruption control to open the semiconductor relay.

6. The switching device according to claim 5, further comprising a reset unit configured to output a reset signal, in response to the determination unit having determined that the transmission path is short-circuited, wherein the controller performs a control to close the semiconductor relay, in response to the reset signal being inputted, and maintains the semiconductor relay in an open state, after the interruption control has been performed a plurality of times within a predetermined time.

7. The switching device according to claim 1, wherein the synchronization control is a control to open and close the semiconductor relay, based on the control signal, without considering the measurement value of the first sensor.

8. The switching device according to claim 1, further comprising:

a second sensor configured to measure a voltage value at a connection node of the switch and the semiconductor relay; and a failure determination unit configured to determine presence/absence of a failure of the semiconductor relay, based on the voltage value detected by the second sensor, wherein the failure determination unit determines presence/absence of a failure of the semiconductor relay, based on the control signal and the voltage value.

9. A switching system comprising:

the switching device according to claim 1; and a switch controller configured to input the control signal to the switching device.

10. A control method for the switching device according to claim 1, the method comprising:

a first control step of controlling the switch by using the control signal;

a measurement step of measuring the current flowing through the semiconductor relay, or the voltage of the semiconductor relay; and a second control step of controlling the semiconductor relay, based on the control signal and the measurement value obtained in the measurement step.

\* \* \* \* \*